(12) United States Patent
Yoo

(10) Patent No.: US 7,829,909 B2
(45) Date of Patent: Nov. 9, 2010

(54) LIGHT EMITTING DIODES AND FABRICATION METHODS THEREOF

(75) Inventor: Myung Cheol Yoo, Pleasanton, CA (US)

(73) Assignee: Verticle, Inc., Dublin, CA (US)

( * ) Notice: Subject to any disclaimer, the term of this patent is extended or adjusted under 35 U.S.C. 154(b) by 257 days.

(21) Appl. No.: 11/755,650

(22) Filed: May 30, 2007

(65) Prior Publication Data

US 2007/0221944 A1  Sep. 27, 2007

Related U.S. Application Data

(63) Continuation-in-part of application No. 11/280,142, filed on Nov. 15, 2005, now Pat. No. 7,459,373.

(51) Int. Cl.
*H01L 33/00* (2010.01)
(52) U.S. Cl. ....................................................... 257/99
(58) Field of Classification Search .................. 257/79, 257/82, 93, 94, 98, 99, 100, 103, 125, 144, 257/152, 164, 183, 189, 190, 198, 432, 433, 257/434, 435, 436, 437, 514, 749, E33.056, 257/E33.057, E33.058, E33.059, E25.032; 438/20, 28, 342, 343, 344, 345, 346
See application file for complete search history.

(56) References Cited

U.S. PATENT DOCUMENTS

| | | | |
|---|---|---|---|
| 3,453,722 A | 7/1969 | Ramsey, Jr. et al. |
| 4,999,694 A | 3/1991 | Austin et al. |
| 5,331,180 A | 7/1994 | Yamada et al. |
| 5,912,477 A | 6/1999 | Negley |
| 5,990,495 A | 11/1999 | Ohba |
| 6,187,606 B1 | 2/2001 | Edmond et al. |
| 6,201,262 B1 | 3/2001 | Edmond et al. |
| 6,232,623 B1 | 5/2001 | Morita |
| 6,281,867 B2 | 8/2001 | Kurematsu et al. |
| 6,455,340 B1 | 9/2002 | Chua et al. |
| 6,459,100 B1 | 10/2002 | Doverspike et al. |
| 6,562,648 B1 | 5/2003 | Wong et al. |
| 6,610,551 B1 | 8/2003 | Doverspike et al. |
| 6,713,789 B1 | 3/2004 | Shibata et al. |
| 6,744,196 B1 | 6/2004 | Jeon |
| 6,756,614 B2 | 6/2004 | Hatano et al. |

(Continued)

OTHER PUBLICATIONS

"Non-Final Office Action", date mailed Nov. 15, 2007, U.S. Appl. No. 11/165,110, filed Jun. 22, 2005; Applicant: Verticle.

(Continued)

*Primary Examiner*—Dao H Nguyen
*Assistant Examiner*—Tram H Nguyen
(74) *Attorney, Agent, or Firm*—Edwards Angell Palmer & Dodge LLP; Kongsik Kim; Peter F. Corless

(57) ABSTRACT

A light emitting diode (LED) may be disclosed. The LED may include a light-emitting side. The LED may also include a first electrode disposed on the light-emitting side. The LED may also include a second electrode. The LED may also include a semiconductor element disposed between the first electrode and the second electrode. The LED may also include a metal support element disposed between the semiconductor element and the second electrode. The metal support element may be configured to provide structural support for the LED.

31 Claims, 29 Drawing Sheets

U.S. PATENT DOCUMENTS

| | | | |
|---|---|---|---|
| 6,759,689 B2 * | 7/2004 | Adomi et al. | 257/98 |
| 7,015,117 B2 | 3/2006 | Urbanek | |
| 7,105,857 B2 | 9/2006 | Nagahama et al. | |
| 7,250,638 B2 | 7/2007 | Lee et al. | |
| 7,384,807 B2 | 6/2008 | Yoo | |
| 7,442,964 B2 * | 10/2008 | Wierer et al. | 257/98 |
| 2001/0010941 A1 | 8/2001 | Morita | |
| 2001/0042866 A1 | 11/2001 | Coman et al. | |
| 2002/0001943 A1 | 1/2002 | Akram | |
| 2002/0036295 A1 | 3/2002 | Nunoue et al. | |
| 2002/0050596 A1 | 5/2002 | Otsuka et al. | |
| 2002/0052076 A1 | 5/2002 | Khan et al. | |
| 2002/0053676 A1 | 5/2002 | Kozaki | |
| 2002/0056914 A1 | 5/2002 | Akram | |
| 2002/0098711 A1 | 7/2002 | Klein et al. | |
| 2002/0102819 A1 | 8/2002 | Tamura et al. | |
| 2002/0102830 A1 | 8/2002 | Ishida | |
| 2002/0106879 A1 | 8/2002 | Akram | |
| 2002/0117677 A1 | 8/2002 | Okuyama et al. | |
| 2002/0146855 A1 | 10/2002 | Goto et al. | |
| 2002/0182889 A1 | 12/2002 | Solomon et al. | |
| 2002/0195609 A1 * | 12/2002 | Yoshitake et al. | 257/81 |
| 2003/0006429 A1 | 1/2003 | Takahashi et al. | |
| 2003/0010975 A1 | 1/2003 | Gibb et al. | |
| 2003/0040133 A1 | 2/2003 | Horng et al. | |
| 2003/0047129 A1 | 3/2003 | Kawahara et al. | |
| 2003/0062530 A1 | 4/2003 | Okazaki et al. | |
| 2003/0080344 A1 | 5/2003 | Yoo | |
| 2003/0114017 A1 | 6/2003 | Wong et al. | |
| 2003/0122141 A1 | 7/2003 | Wong et al. | |
| 2003/0139037 A1 | 7/2003 | Kobayashi et al. | |
| 2003/0189212 A1 | 10/2003 | Yoo | |
| 2003/0189215 A1 | 10/2003 | Lee et al. | |
| 2003/0190770 A1 | 10/2003 | Yeom et al. | |
| 2003/0230757 A1 | 12/2003 | Suehiro et al. | |
| 2004/0072383 A1 | 4/2004 | Nagahama et al. | |
| 2004/0245543 A1 | 12/2004 | Yoo | |
| 2005/0082543 A1 | 4/2005 | Alizadeh et al. | |
| 2005/0189551 A1 | 9/2005 | Peng et al. | |
| 2005/0242365 A1 | 11/2005 | Yoo | |
| 2006/0006554 A1 | 1/2006 | Yoo | |
| 2006/0105542 A1 | 5/2006 | Yoo | |
| 2006/0148115 A1 | 7/2006 | Yoo | |

OTHER PUBLICATIONS

"Written Opinion", date mailed Dec. 7, 2007, International Application No. PCT/US05/22785; Filed on Jun. 22, 2005; Applicant: Verticle.

"Continuous-Wave Operation of InGaN Multiple-Quantum-Well Laser Diodes on Copper Substrates Obtained by Laser Liftoff," Mar./Apr. 2001, IEEE Journal on Selected Topics in Quantum Electronics, vol. 7, No. 2.

Wong, et al. "Continuous-Wave InGaN Multiple-Quantum-Well Laser Diodes on Copper Substrates," Feb. 26, 2001, Applied Physics Letters vol. 78, No. 9. http://apl.aip.org/apl/copyright.jsp.

"The Integration of $In_xGa_{1-x}N$ Multiple-Quantum-Well Laser Diodes with Copper Substrates by Laser Lift-Off," Dec. 1, 2000, Jpn. J. Appl. Phys. vol. 39 (2000) pp. L 1203-L 1205, Part 2, No. 12A.

"Non Final Office Action", U.S. Appl. No. 11/165,110, Mailing Date: Jan. 7, 2009.

"Second Office Action", Issued in Chinese Application No. 200580020642.7; Mailing Date: May 15, 2009.

"International Search Report", Issued in PCT Application No. PCT/US05/14634; Mailing Date: Aug. 4, 2008.

"Written Opinion", Issued in PCT Application No. PCT/US05/14634; Mailing Date: Aug. 4, 2008.

"International Search Report", Issued in PCT Application No. PCT/US2005/41467; Mailing Date: May 19, 2008.

"Written Opinion", Issued in PCT Application No. PCT/US2005/41467; Mailing Date: May 19, 2008.

"International Report on Patentability", Issued in PCT Application No. PCT/US2005/041467; Mailing Date: Jul. 3, 2008.

"International Search Report", Issued in PCT Application No. PCT/US2008/065355; Mailing Date: Sep. 29, 2008.

"Written Opinion", Issued in PCT Application No. PCT/US2008/065355; Mailing Date: Sep. 29, 2008.

"International Preliminary Report on Patentability", Issued in PCT Application No. PCT/US/2005/014634; Mailing Date: Sep. 12, 2008.

International Preliminary Report on Patentability, mailed Jan. 4, 2007, for International Application No. PCT/US2004/017297; Filed on Jun. 3, 2004; Applicant: Yoo, Myung Cheol.

International Written Opinion, mailed Nov. 22, 2006, for International Application No. PCT/US2004/017297; Filed on Jun. 3, 2004; Applicant: Yoo, Myung Cheol.

International Search Report, mailed Nov. 22, 2006, for International Application No. PCT/US2004/017297; Filed on Jun. 3, 2004; Applicant: Yoo Myung Cheol.

"Notice of Office Action," mailed Nov. 29, 2005, for U.S. Appl. No. 10/861,743, filed Jun. 3, 2004; Inventors: Yoo, Myung Cheol.

"Notice of Office Action," mailed Jun. 14, 2006, for U.S. Appl. No. 10/861,743, filed Jun. 3, 2004; Inventors: Yoo, Myung Cheol.

"Notice of Office Action," mailed Jun. 4, 2007, for U.S. Appl. No. 10/861,743, filed Jun. 3, 2004: Inventors: Yoo, Myung Cheol.

"Notice of Office Action," mailed Jan. 4, 2007, for U.S. Appl. No. 10/861,743, filed Jun. 3, 2004; Inventors: Yoo, Myung Cheol.

"Notice of Office Action," mailed Sep. 27, 2006, for U.S. Appl. No. 11/117,084, filed Apr. 27, 2005; Inventors: Yoo.

"Notice of Office Action," mailed Apr. 3 2007, for U.S. Appl. No. 11/117,084, filed Apr. 27, 2005; Inventors: Yoo.

International Search Report, mailed Oct. 2, 2006, for International Application No. PCT/US2005/22785; Filed on Jun. 22, 2005; Applicant: Verticle.

International Written Opinion, mailed Oct. 2, 2006, for International Application No. PCT/US2005/22785; Filed on Jun. 22, 2005; Applicant: Verticle.

"International Preliminary Report on Patentability", Issued in PCT Application No. PCT/US2008/065355; Mailing Date: Dec. 10, 2009.

* cited by examiner

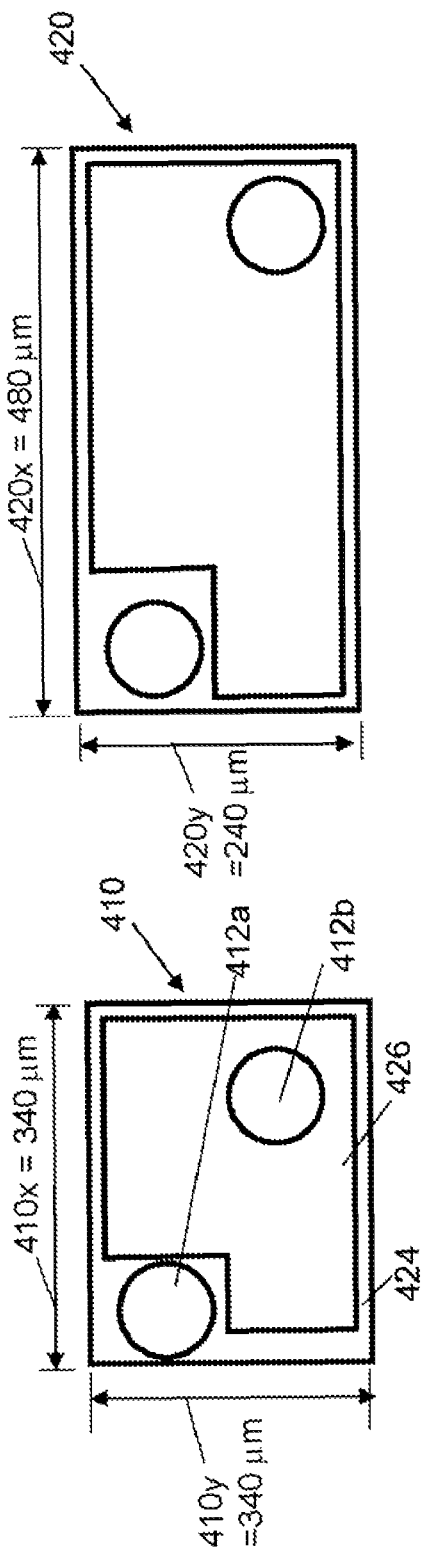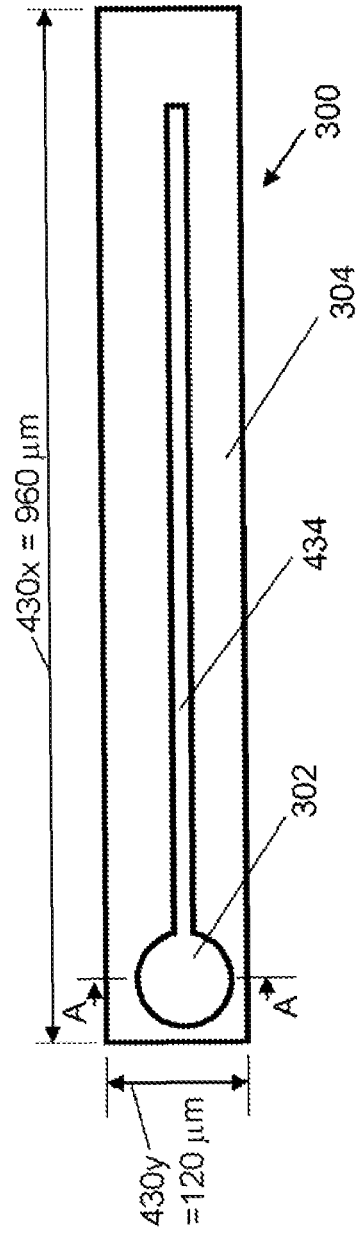
Fig. 4A (Prior Art)
Fig. 4B (Prior Art)
Fig. 4C

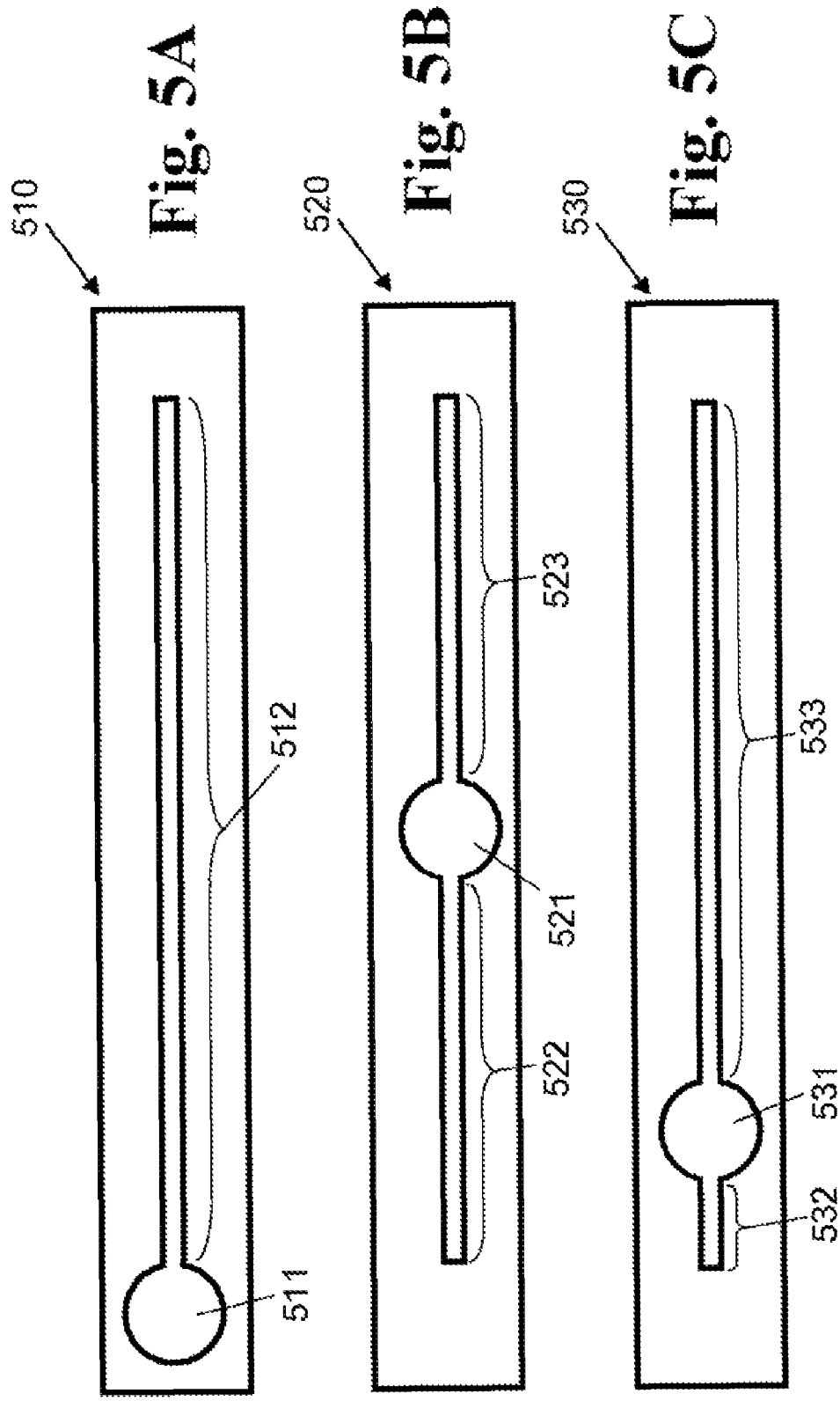

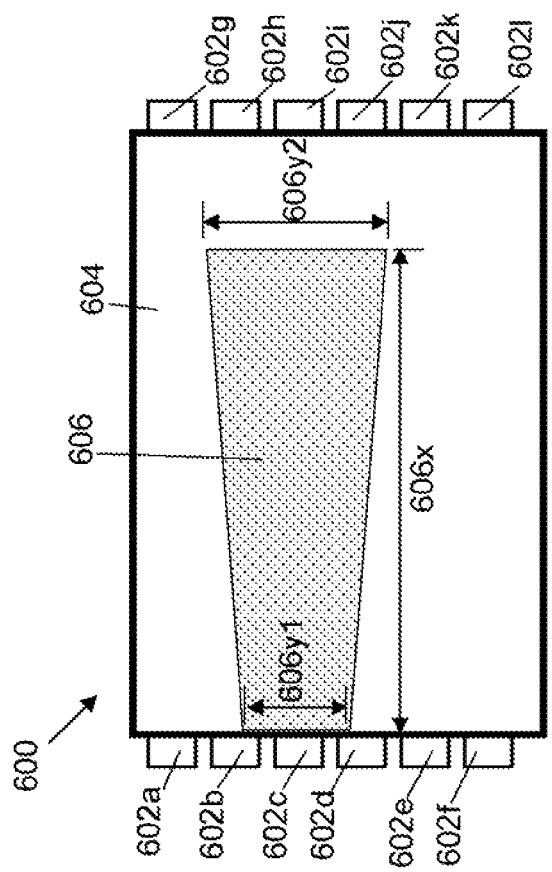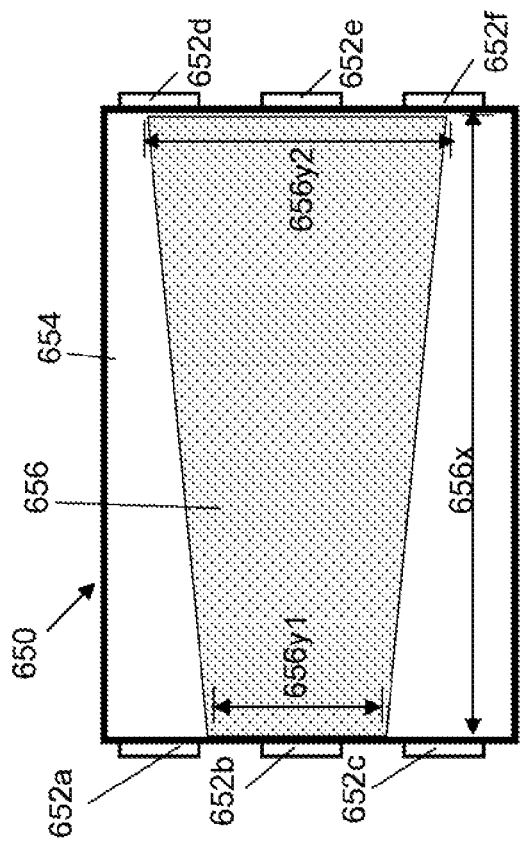

LIGHT EMITTING DIODES AND FABRICATION METHODS THEREOF

RELATED APPLICATIONS

This application is a continuation-in-part of application Ser. No. 11/208,142, filed Nov. 15, 2005 now U.S. Pat. No. 7,459,373 by inventor Myung Cheol Yoo. This application claims the benefit of application Ser. No. 11/280,142 under 35 USC 120.

BACKGROUND OF THE INVENTION

The present invention relates to light emitting diodes (LEDs) devices and fabricating LEDs. LEDs have been utilized in back light units (BLUs) for illuminating liquid crystal displays (LCDs) employed in electronic devices, such as notebook computers, cellular phones, LCD-TVs etc. For example, LED BLUs may be deployed along one or two edges of a BLU of an electronic device for illuminating the LCD without substantially increasing the thickness of the display and/or the electronic device. Given the trends of portability/mobility, miniaturization, commoditization, etc. in the electronic device industry, arrangements of LED BLUs may be required to minimize power consumption, form factors, and material/manufacturing costs of electronic devices, while maximizing light output and optimizing light beam profiles. Typically, conventional LEDs cannot satisfy these requirements.

A conventional LED may typically be supported by a sapphire- or SiC-based substrate. With the sapphire- or SiC-based substrate, the conventional LED may only be able to include a p-type ITO current spreading layer, but not an n-type current spreading layer. The p-type ITO typically has a relatively lower conductivity compared with an n-type ITO. Given the p-type ITO current spreading layer, the conventional LED may not be useful to fabricate large aspect ratio devices due to limited current spreading.

Further, the sapphire- or SiC-based substrate may typically be too fragile to have an elongated device configuration. Accordingly, the light-emitting side of the conventional LED may be limited to having a low length-to-width ratio (or aspect ratio), such as 1:1 or 2:1, in order that the conventional LED may have sufficient structural strength. When conventional LED BLUs are deployed along edges of a thin LCD, a large number of the LEDs may be required, in order to provide sufficient and homogenous illumination on the LCD. As a result, material and manufacturing costs may be increased. The large number of LEDs also may require a large amount of electricity input. As a result, power consumption may be relatively high. At the same time, a large amount of heat may be generated. The heat may degrade the performance (e.g., color) and durability of the LCD.

Conventional methods for manufacturing LEDs also may result in a high cost of the conventional LEDs and therefore may increase the cost of electronic devices. Conventional methods for making a separating semiconductor devices may include depositing layers to form numerous semiconductor devices on a wafer substrate and then utilizing mechanical techniques to separate the individual devices. The separation is typically performed by dicing or scribing the substrate to separate the individual devices. Dicing is typically done with a diamond saw, diamond scriber or laser, which may typically be a time consuming process performed by very expensive machines. Accordingly, problems associated with the conventional methods may include one or more of process yield issues, device performance issues, and processing cost issues.

1. Process Yield Issues

According to conventional mechanical device separation methods, such as dicing and scribing methods, and a laser scribing method, each individual device is separated by cutting along a grid line, or street line, between the devices with the selected method. This is a slow process since each of the street lines is cut one at a time and sequentially Process yield issues become more significant for semiconductor devices having hard substrate materials, such as GaN on sapphire or GaN on SiC materials. Furthermore, the separation yield is greatly affected by any cracks or defects created by substrate grinding and polishing. If the cutting lines pass through defective areas, the result is very low device separation yield.

As a result, device separation is known to be the most tedious and low yield process among the entire semiconductor device fabrication processes. In practical terms, the back-end process yield for the GaN-based semiconductor fabrication is known to be as low as less than 50%, while the front-end fabrication process yield is typically in the range of above 90%.

2. Device Performance Issues

Due to the physical abrasive action of dicing and scribing, the device performance after device separation may be significantly deteriorated. For example, the LED side wall where the light emits may become damaged due to abrasive cutting action during device separation, which is the main cause of light output reduction after device separation.

In the case of laser scribing, the device separation is accomplished by melting the substrate material with a high intensity laser beam. As a result, the melted substrate material often accumulates on the side wall of the device, which results in lowering light output of the LED as well.

3. Process Cost Issue

The average die separation processing time for GaN/sapphire LED having approximately 10,000~12,000 devices per wafer is approximately 40 min to 1 hour with the conventional separation methods. This means that one device separation machine can handle only 24 to 36 wafers per day (700~1,000 wafers/month) if the machine operates 24 hours/day. In order to achieve a commercially desirable factory output, many machines and significant capital equipment investment is needed.

In addition, the diamond cutting wheels for dicing machine and diamond tips for the scribing machine are very expensive consumable parts, hence there are significant consumable part cost involve with the conventional die separation processes.

In the case of laser scribing, the major consumable part is the laser source. In order to maintain constant laser beam energy, the laser source gas must be recharged regularly. The laser source is the one of the most expensive components in the laser scribing system.

SUMMARY

An embodiment of the invention relates to a light emitting diode (LED). The LED may include a light-emitting side. The LED may also include a first electrode disposed on the light-emitting side. The LED may also include a second electrode. The LED may also include a semiconductor element disposed between the first electrode and the second electrode. The LED may also include a metal support element disposed between the semiconductor element and the second electrode. The metal support element may be configured to provide structural support for the LED.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 4A-C illustrates a comparison between light-emitting sides of prior art LEDs with a light emitting side of a LED that is configured in accordance with one or more embodiments of the present invention.

FIGS. 5A-F illustrate example configurations of fingers (i.e., electrode extensions) of LEDs in accordance with one or more embodiments of the present invention.

FIGS. 6A-B illustrate a comparison between a prior art LED arrangement and an LED arrangement in accordance with one or more embodiments of the invention utilized in LCD backlight unit applications.

DETAILED DESCRIPTION

Figure 1:
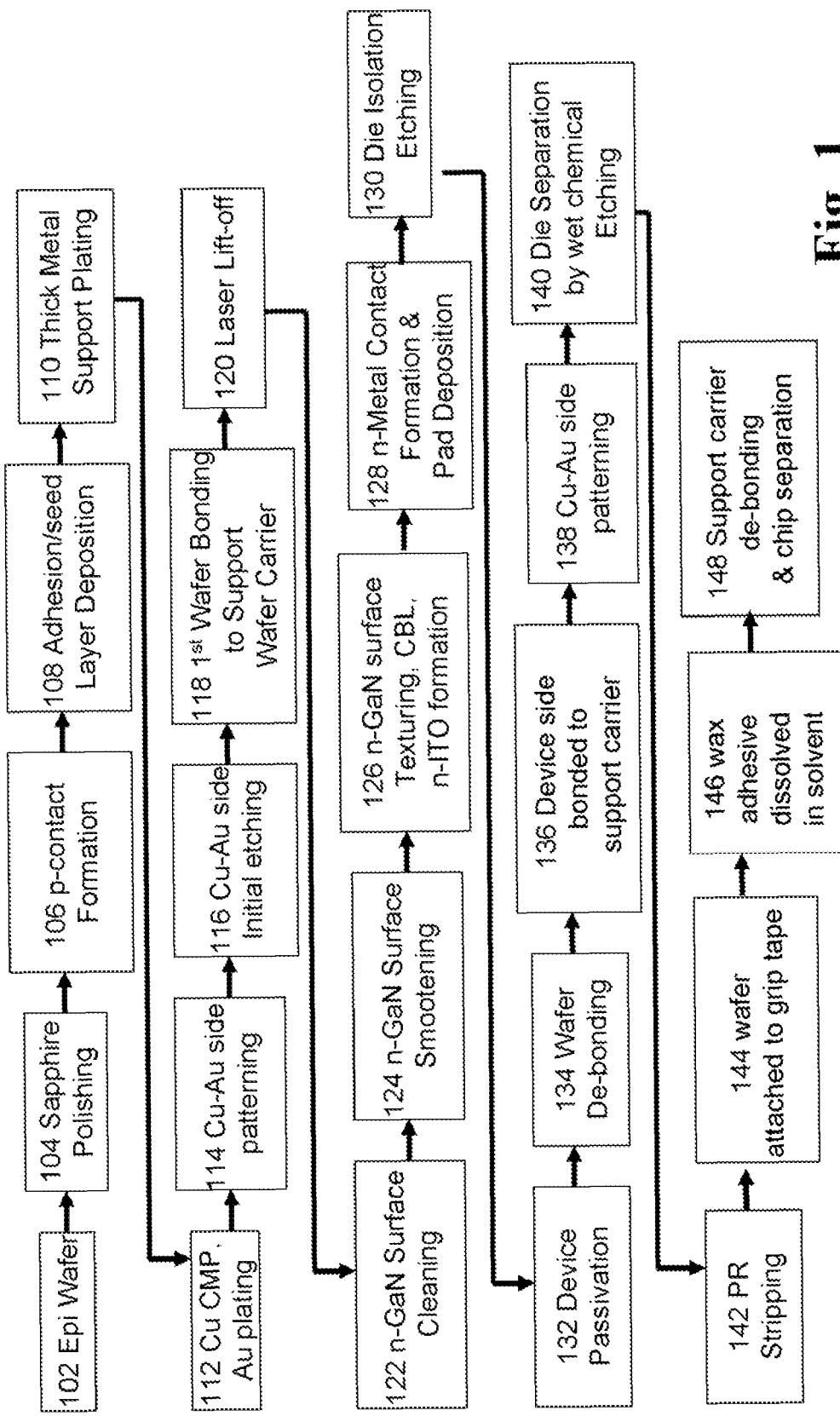
FIG. 1 illustrates a flowchart of a method for fabricating light emitting diodes (LEDs) in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a light emitting diode (LED). The LED may include a light-emitting side. The LED may also include a first electrode disposed on the light-emitting side. The LED may also include a second electrode. The LED may also include a semiconductor element disposed between the first electrode and the second electrode. The LED may also include a metal support element disposed between the semiconductor element and the second electrode. The metal support element may be configured to provide structural support and electrical conduction for the LED.

A length of the light-emitting side may be at least three times a width of the light-emitting side. Alternatively or additionally, a length of the light-emitting side may be at least seven times a width of the light-emitting side. For example, in one or more embodiments, a length-to-width ratio (or aspect ratio) of the light-emitting side may be about 8, in contrast to 2 or less associated with a typical prior-art LED structures having a sapphire or SiC substrate.

The high length-to-width ratio may be enabled by the metal support element, which may have a thickness greater than 50 μm and may include one or more metal elements or layers. The metal support element may include a first metal element and a second metal element. The first element may be configured to reduce stress buildup in the LED. The first metal element may be softer than the second metal element. The first metal element may be disposed closer to the semiconductor element than the second metal element. The metal support element may be made of one or more materials including Cu.

The first electrode may be a cathode, and the second electrode may be an anode. Alternatively, the first electrode may be an anode, and the second electrode may be a cathode. The second electrode may be electrically coupled with the metal support element and may be configured to protect the metal support element from oxidation.

The first electrode may include a first extension disposed on the light-emitting side and configured for spreading current on the light-emitting side. A length of the first extension may be at least three times a width of the light-emitting side. Alternatively or additionally, the first electrode may further include a second extension. The first extension and the second extension may have a same length. Alternatively or additionally, the first extension and the second extension may have a same width but different lengths.

In one or more embodiments, the first extension may include a first section, a second section, and a third section between the first section and the second section. The first section may be disposed closer to a first edge of the light-emitting side than the second section, and the second section may be disposed closer to a second edge of the light-emitting side than the first section. The first section may be parallel to the first edge of the light-emitting side, and the second section may be parallel to the second edge of the light-emitting side.

The LED may also include a third electrode disposed on the light-emitting side. The first electrode and the third electrode may have a same polarity. The third electrode may include an extended portion configured to facilitate current spreading on the light-emitting side. The extended portion may be aligned with the first extension. Alternatively or additionally, the first extension may be disposed closer to a first edge of the light-emitting side than the extended portion.

The semiconductor element may include a p-type portion and an n-type portion. The p-type portion may be disposed closer to the metal support element than the n-type portion. The n-type portion may be disposed closer to the light-emitting side than the p-type portion. The semiconductor element may be made of one or more materials including at least one of GaN, AlGaN, AlGaAs, AlGaP, AlGaInP, GaAsP, GaP, and InGaN. The semiconductor element may include a textured surface configured to optimize photon escape angles. The textured surface may be a surface of an n-type portion of the semiconductor element.

The LED may also include a current blocking element disposed between the first electrode and the semiconductor element. The current blocking element may be disposed on an n-type portion of the semiconductor and configured to expel electrons.

The LED may also include an n-type ITO element disposed between the first electrode and the semiconductor element. The n-type ITO element may be in contact with the current blocking element and in contact with the textured surface of the n-type portion of the semiconductor element.

The LED may also include a metal intermediate layer disposed between the semiconductor element and the metal support element. The metal intermediate layer may be in contact with the metal support element. For example, the metal intermediate layer may be formed of Au.

The LED may also include one or more adhesion layers disposed between the semiconductor element and the metal support element. The one or more adhesion layers may be configured to form part of an electrical path between the semiconductor element and the metal support element. The one or more adhesion layers may include a first adhesion layer in contact with a metal contact (a p-contact or an n-contact), a second adhesion layer in contact with the metal intermediate layer, and a third adhesion layer disposed between the first adhesion layer and the second adhesion layer. The metal contact may be in contact with the semiconductor element. The one or more adhesion layers may be made of one or more of Ni, Au, and Pd.

The method for fabricating the vertical structure of the LED may involve utilizing one or more metal deposition processes to form a metal substrate for mechanical support and electrical conductivity and utilizing one or more laser lift-off (LLO) processes to remove the original substrate.

In one or more embodiments, the fabrication methods described herein may not be limited to LED fabrication, but may also be applied to other device structures, particularly structures containing GaN-based epitaxial thin films grown on the insulating or semi-conductive substrate, such as laser diodes (LD), Hetero-junction Bipolar Transistor (BT), High Electron Mobility Transistor (HEMT).

The features and advantages of the present invention may be better understood with reference to the figures and discussions that follow.

FIG. 1 illustrates a flowchart of a method for fabricating light emitting diodes (LEDs) in accordance with one or more embodiments of the present invention. The process may start with step 102, in which an epitaxial wafer (which may be a commercially available product well-known to one of ordinary skill in the art) may be utilized. The epitaxial wafer may include a sapphire substrate and a semiconductor layer, such as a GaN layer. The GaN layer may include an n-type GaN layer attached to the sapphire substrate and a p-type GaN layer.

In step 104, a surface of the sapphire substrate may be polished (e.g., lapped) for subsequent laser lift-off.

In step 106, one or more p-metal contacts may be formed on the p-type GaN layer of the epitaxial wafer.

In step 108, one or more adhesion layers (e.g., an Ni layer) and one or more seed/intermediate layer (e.g., an Au layer) may be formed on the p-type GaN layer and the one or more p-metal contacts.

In step 110, a relatively thick metal support layer (e.g., a Cu layer) may be formed on the one or more intermediate layers, for example, through electroplating.

In step 112, chemical mechanical polishing (CMP) may be performed on a surface of the metal support layer.

In step 112, a protective layer (e.g., an Au layer) may be formed on the metal support layer after CMP.

In step 114, patterning with photoresists may be performed on the support-protective side (e.g., Cu—Au side) of the structure resulted from step 112.

In step 116, initial etching by wet chemical etching may be performed on the support-protective side of the structure resulted from step 114.

In step 118, the structure resulted from step 116 may be bonded to a support carrier, for example, utilizing thermal plastic adhesive.

In step 120, the sapphire substrate may be removed from the structure given by step 118, for example, through a laser lift-off process.

In step 122, a surface of the n-type GaN layer may be cleaned to remove Ga drops, for example, utilizing HCl solution.

In step 124, the cleaned surface of the n-type GaN layer may be further smoothened, for example, by dry etching.

In step 126, the cleaned and smoothened surface of the n-type GaN layer may be further textured for optimizing photon escape angles on the surface. In step 126, one or more current blocking layer elements (CBL elements) may be formed on the textured surface. Further, an n-type current spreading layer (e.g., an n-type ITO layer) may also be formed on the textured surface of the n-type GaN layer, covering the one or more CBL elements.

In step 128, one or more n-metal contacts may be formed on the n-type ITO current spreading layer.

In step 130, die isolation etching may be performed, for example, by dry etching, for isolating GaN elements.

In step 132, the isolated GaN elements/dies may be coated with passivation layers (e.g., $SiO_2$ layers).

In step 134, support carrier de-bounding may be performed such that the support carrier (bonded in step 118) may be removed from the support-protective side (e.g., Cu—Au side) of the structure given by step 132.

In step 136, a second support carrier may be bonded, for example, utilizing wax adhesive, to the device side (i.e., the GaN and n-metal contact side) of the structure resulted from step 134.

In step 138, patterning may be performed on the support-protective side (e.g., Cu—Au side) utilizing photoresists.

In step 140, die separation may be performed, for example, by wet chemical etching, such that individual LEDs may be separated while still being bonded to the second support carrier.

In step 142, the photoresists may be removed/stripped.

In step 144, the support-protective side (e.g., the Cu—Au side) of the structure given by step 142, may be mounted on a grip tape, e.g., a blue tape or UV tape.

In step 146, the structure given by step 144 (or at least the device side of the structure) may be immersed in a solvent (e.g., IPA, or Isopropyl Alcohol). A solvent with selectivity may be utilized such that only the wax adhesive (but not other elements in the structure) may be dissolved. Accordingly, the wax adhesive may be dissolved for releasing the support carrier from the device side of the structure.

In step 148, the support carrier may be removed, and the grip tape may be expanded such that individual LEDs are completely separated as final devices.

Figure 2A:
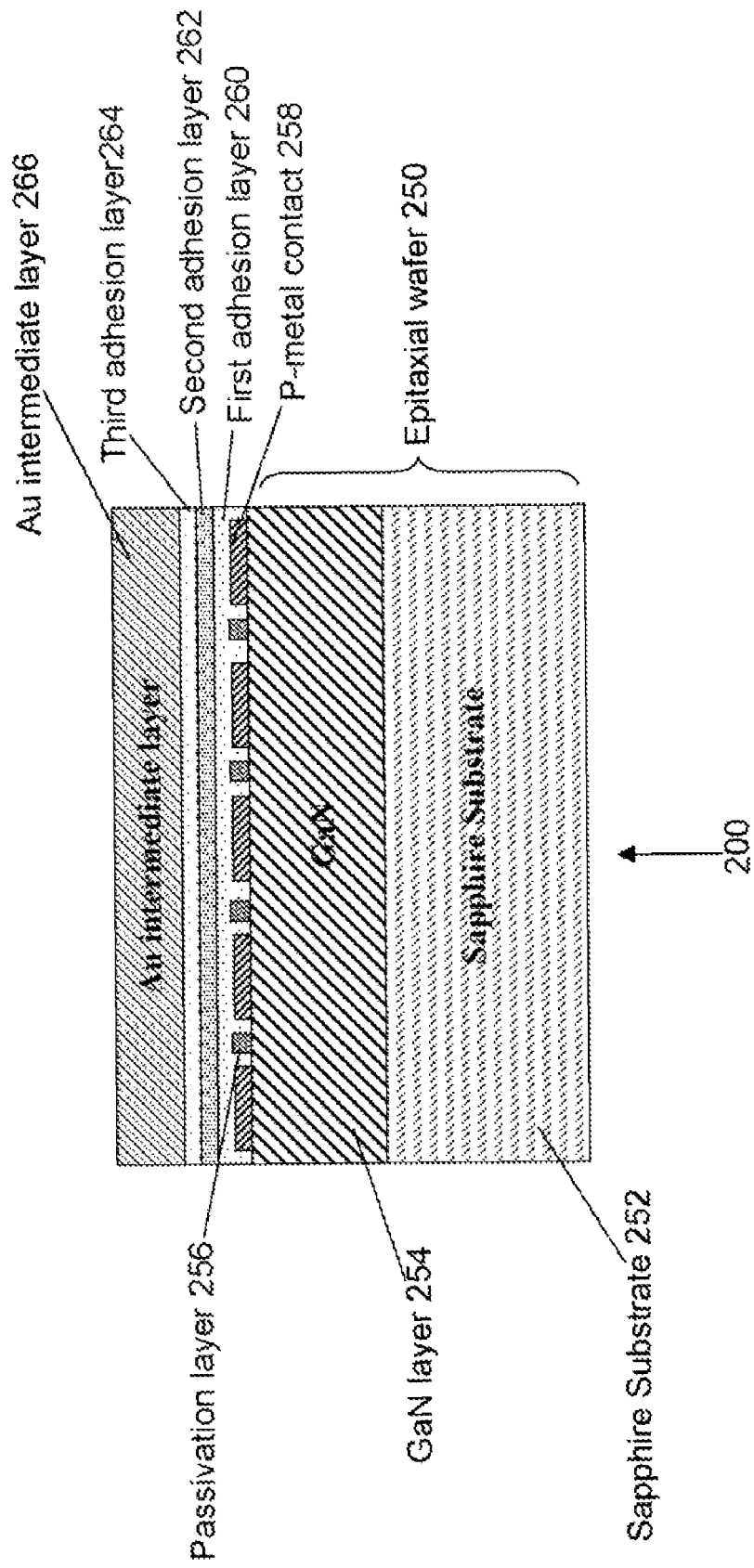
FIGS. 2A-W illustrate schematic representations of (partial) cross sectional views of wafer structures resulted from steps in a process of fabricating light emitting devices (LEDs) in accordance with one or more embodiments of the present invention.
Figure 2B:
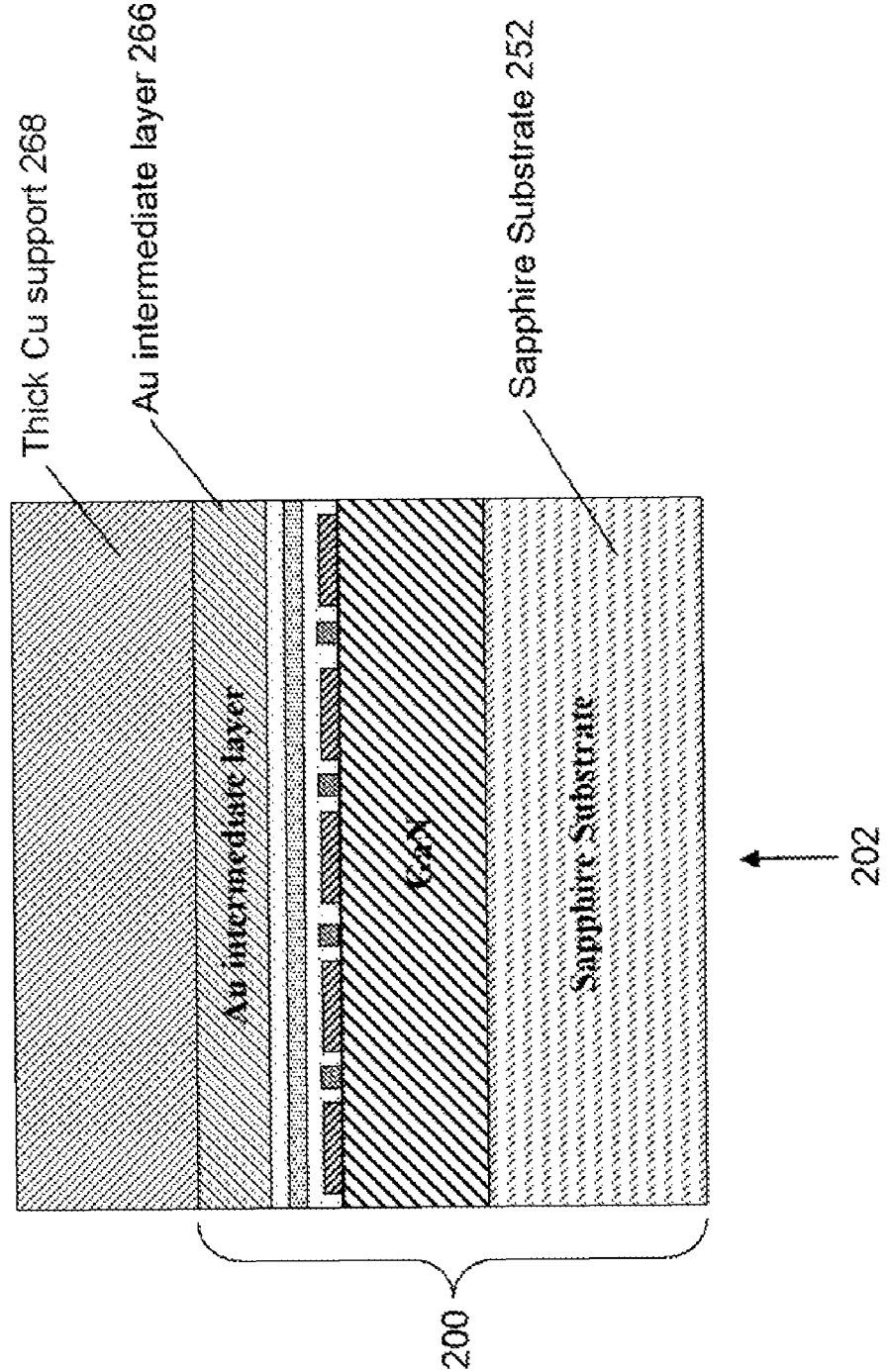
Figure 2C:
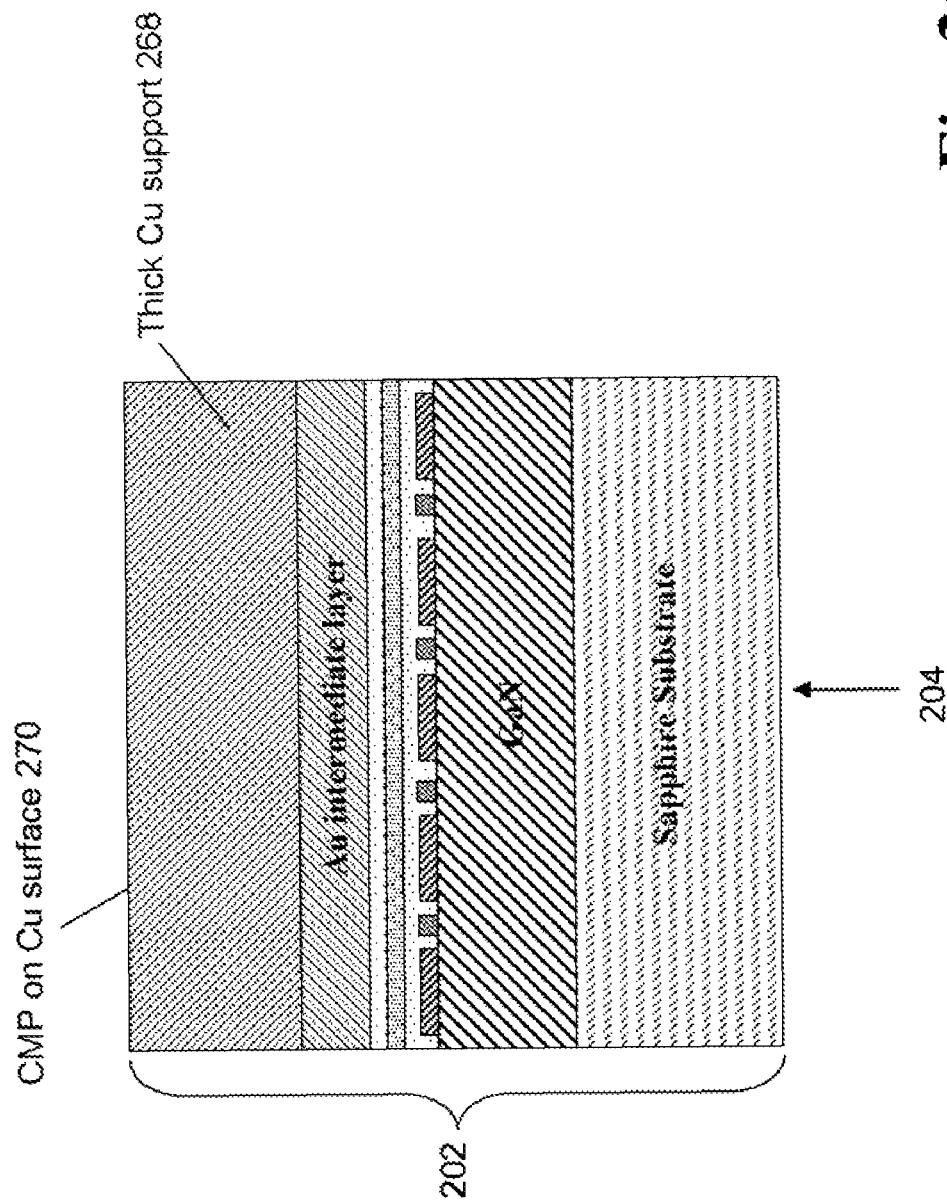
Figure 2D:
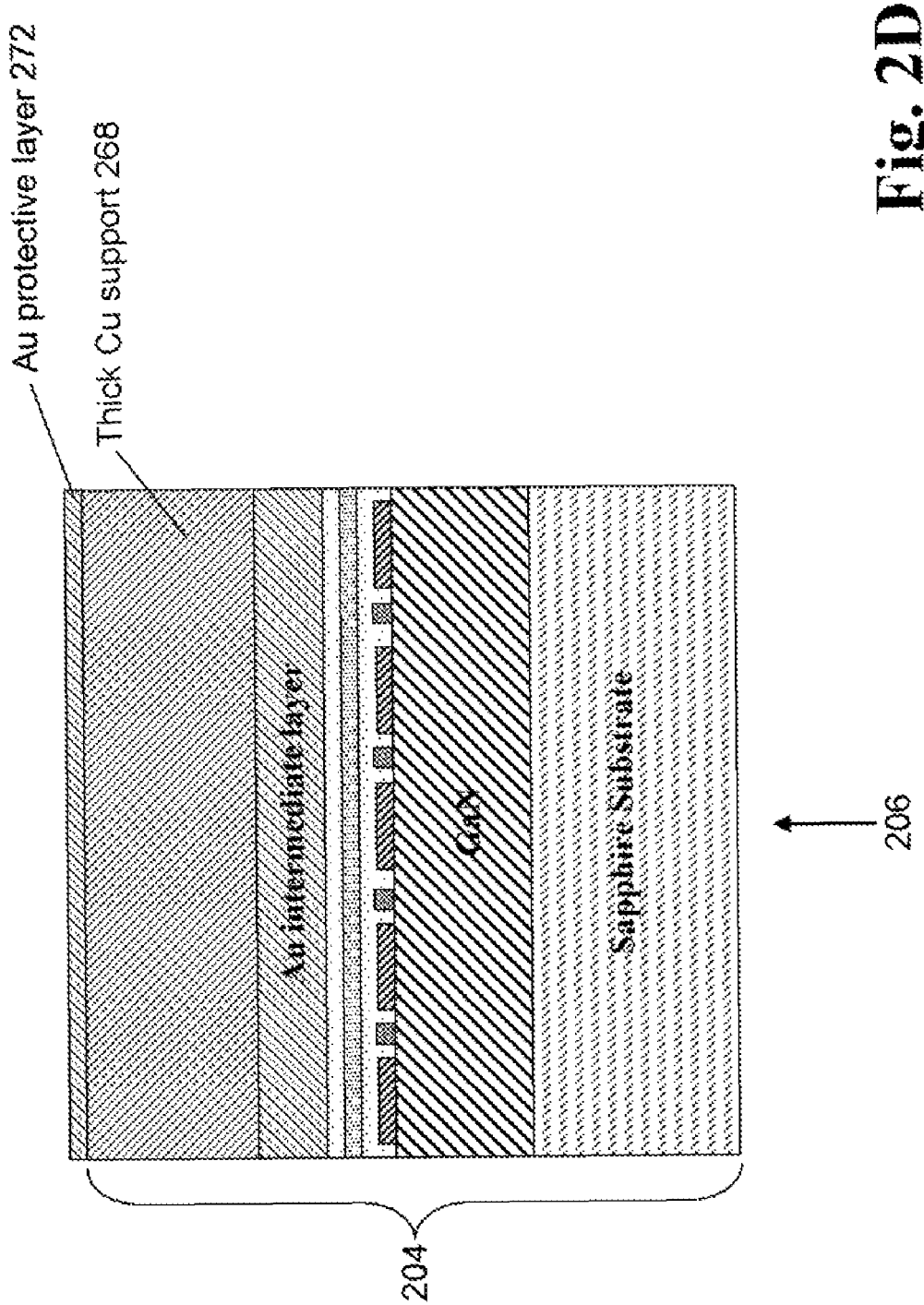
Figure 2E:
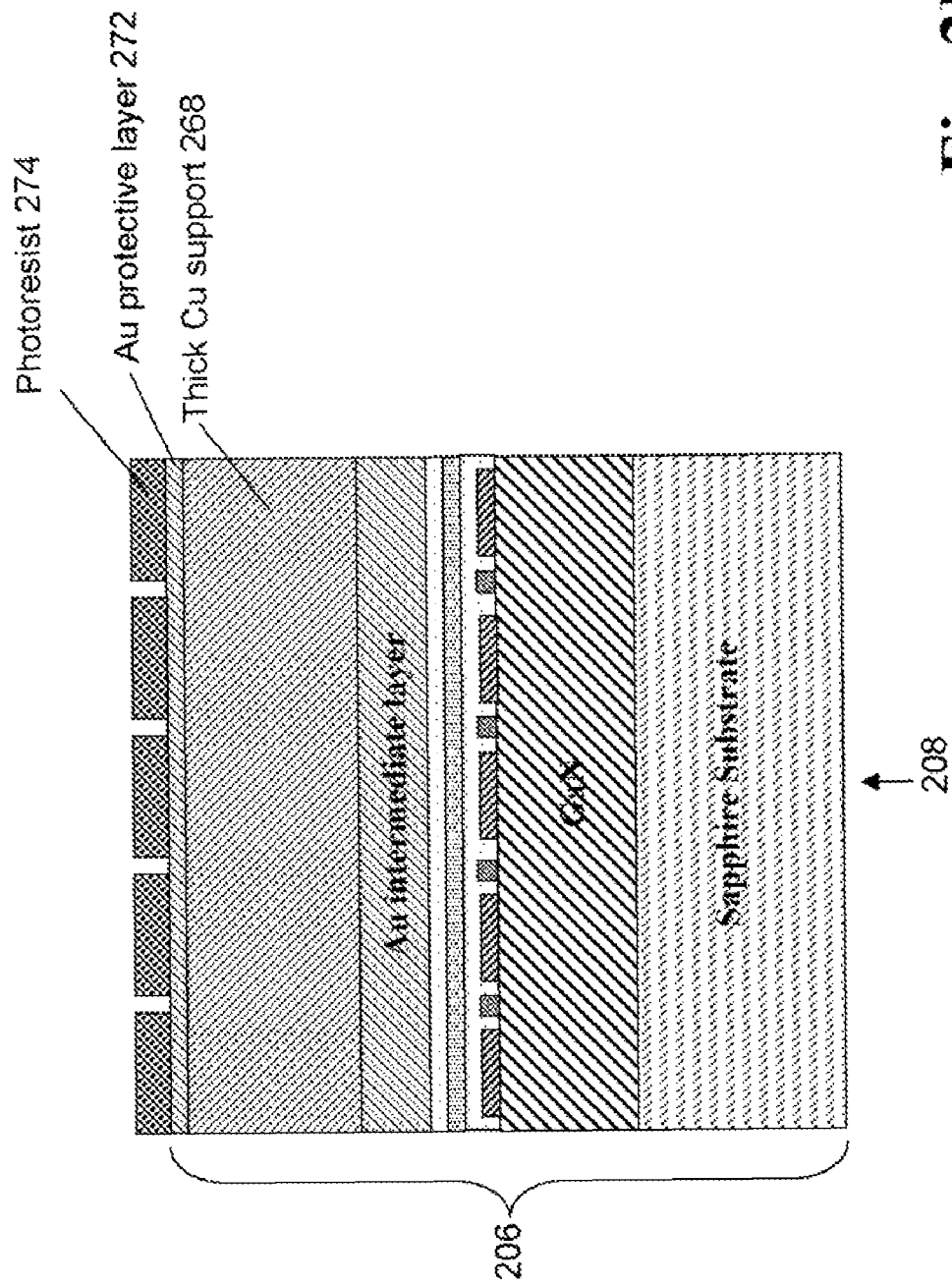
Figure 2F:
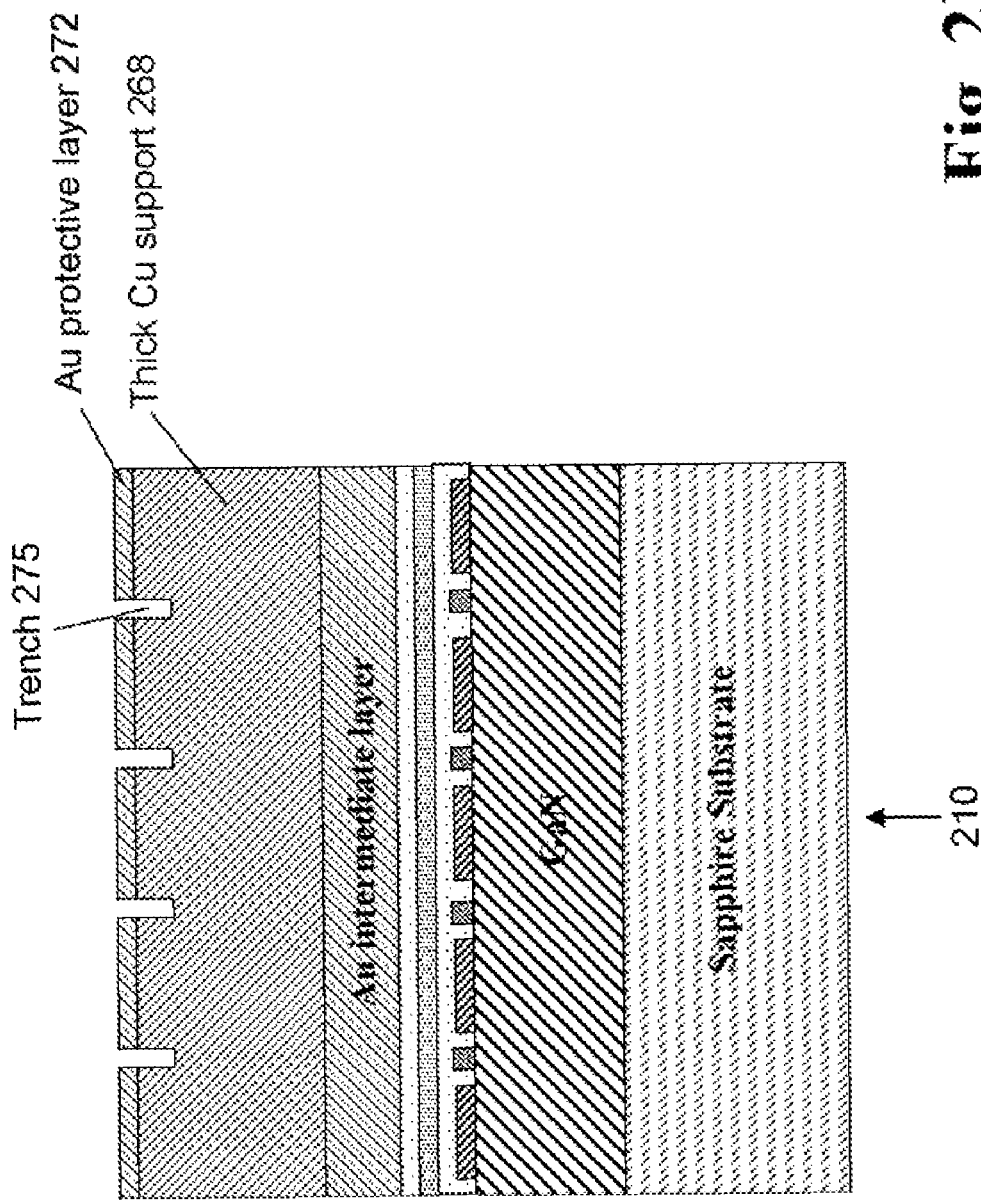
Figure 2G:
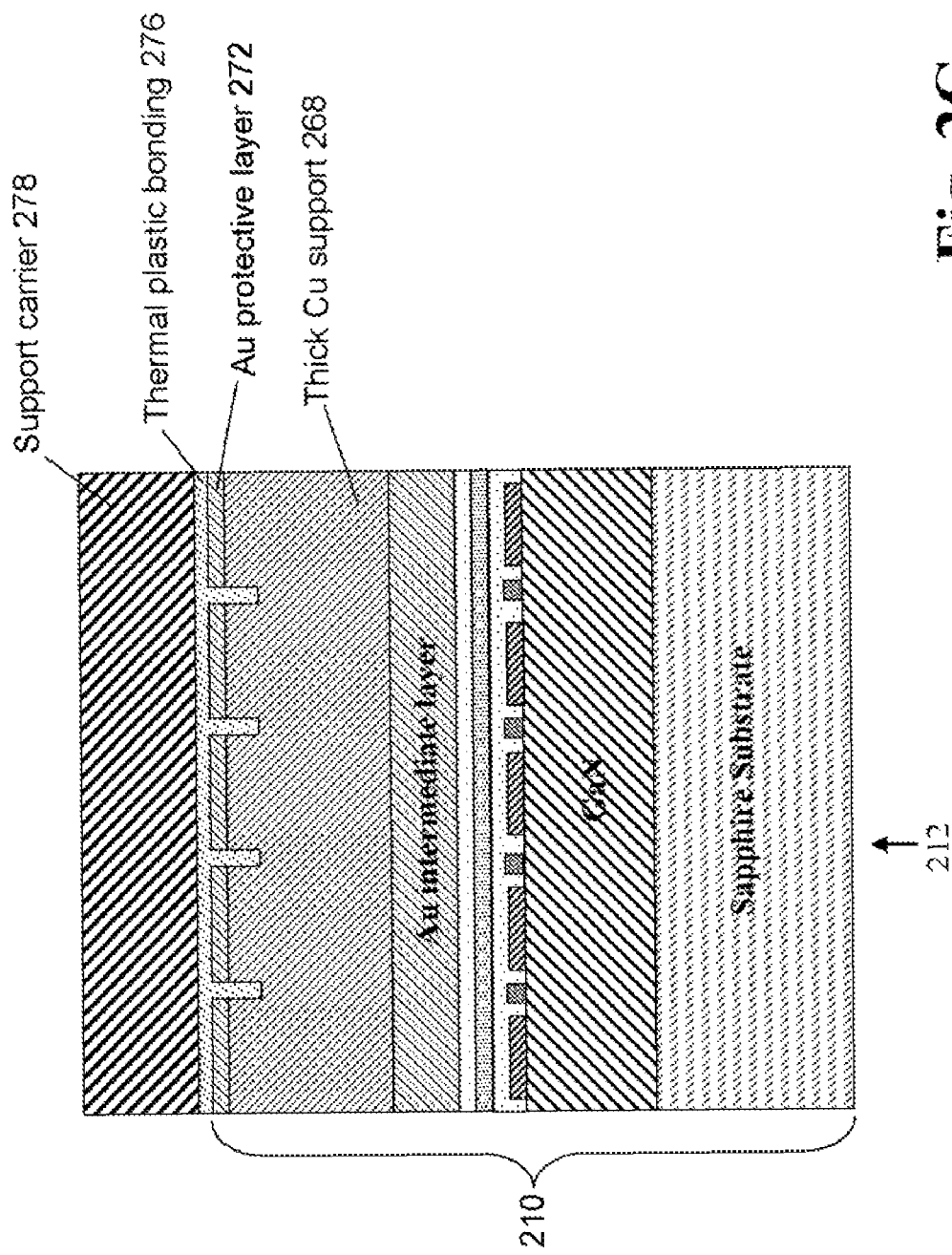
Figure 2H:
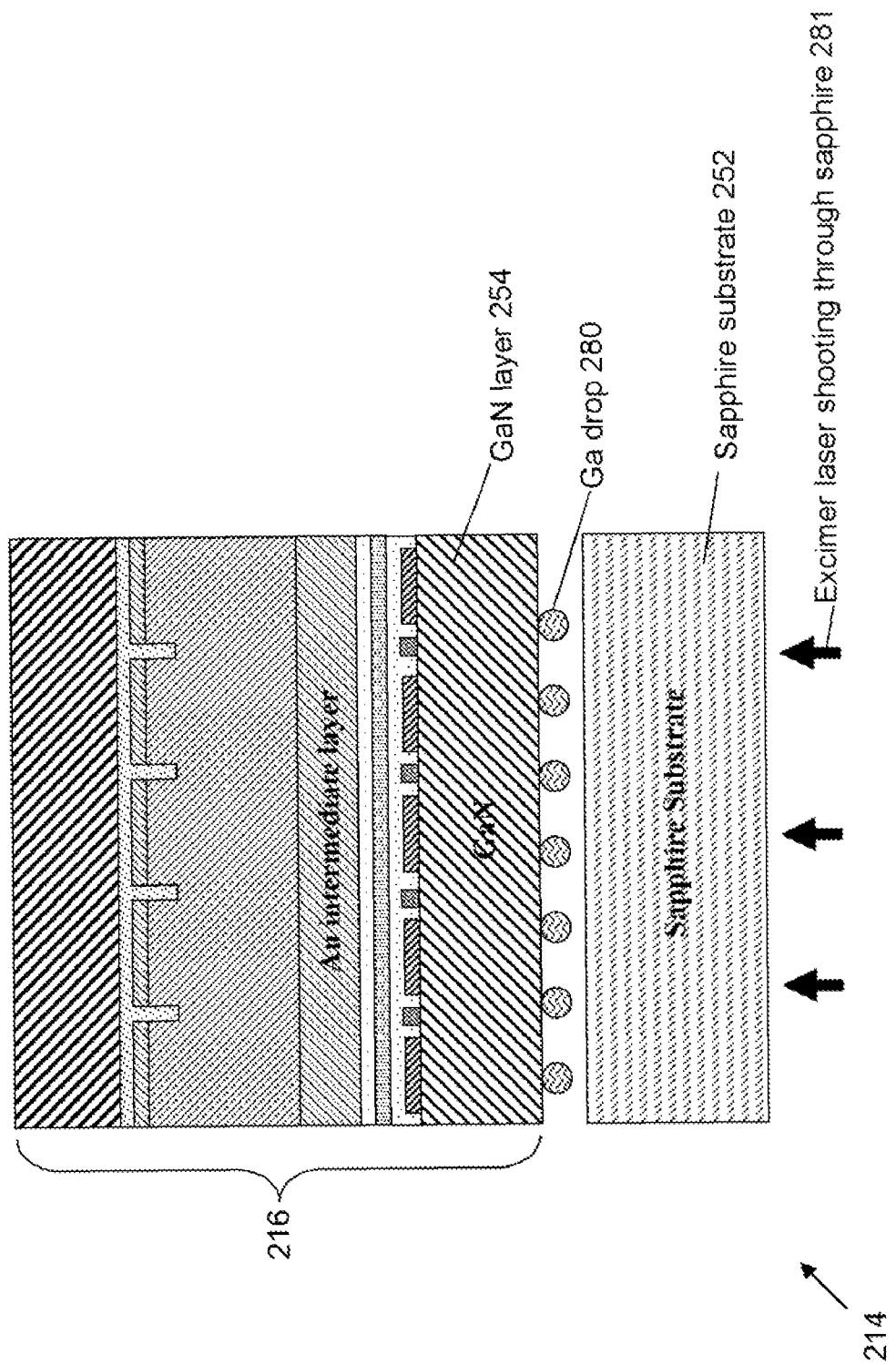
Figure 2I:
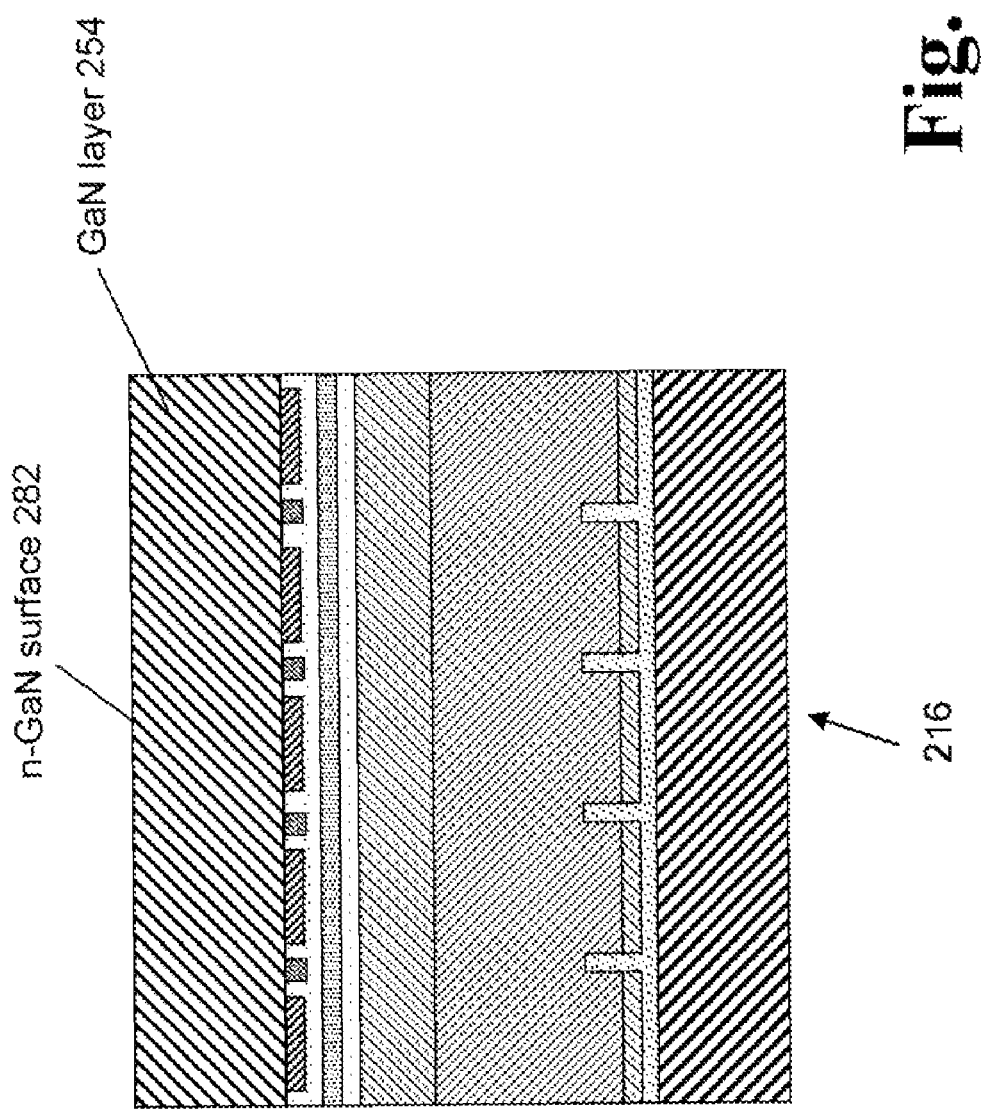
Figure 2J:
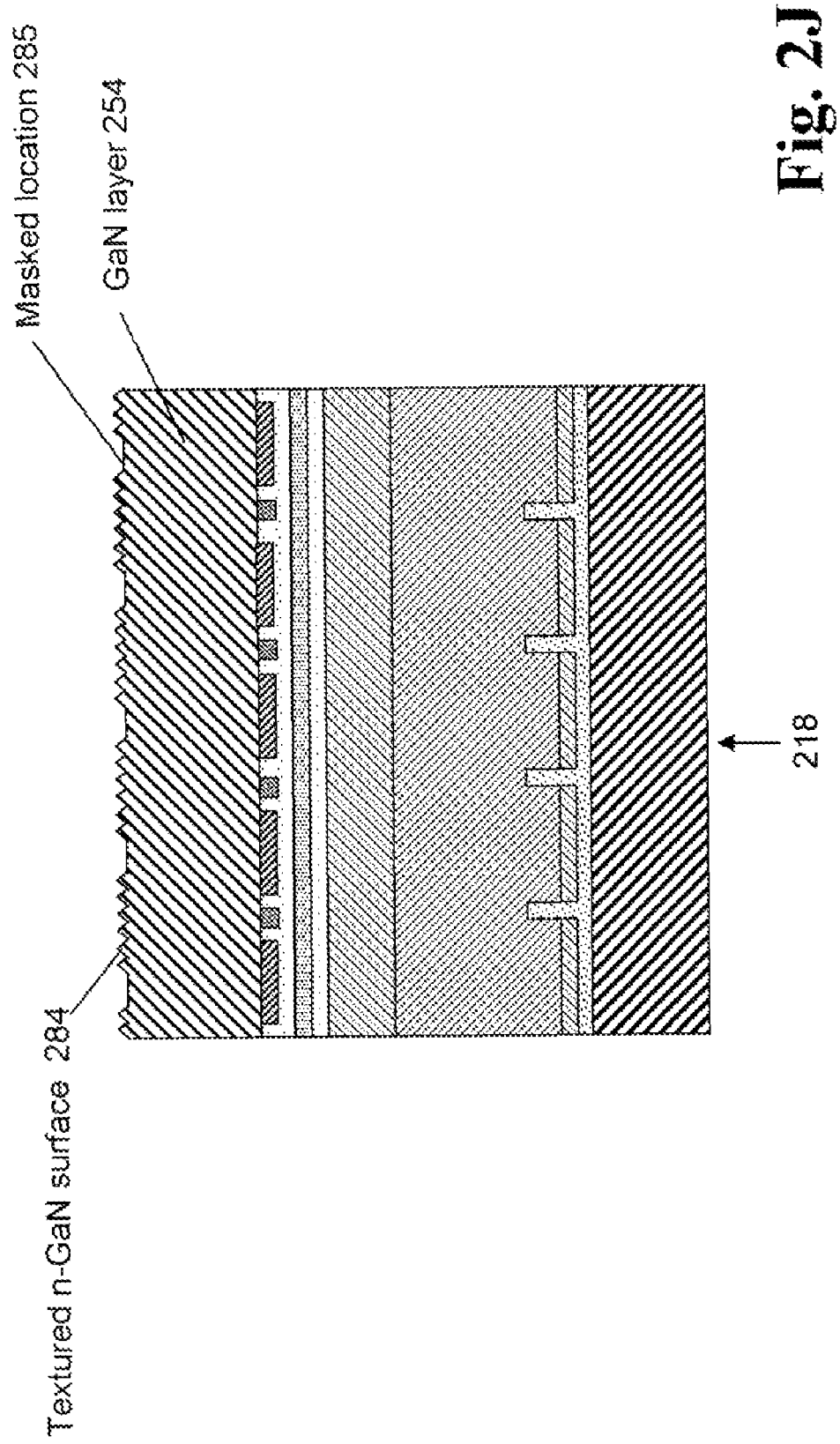
Figure 2K:
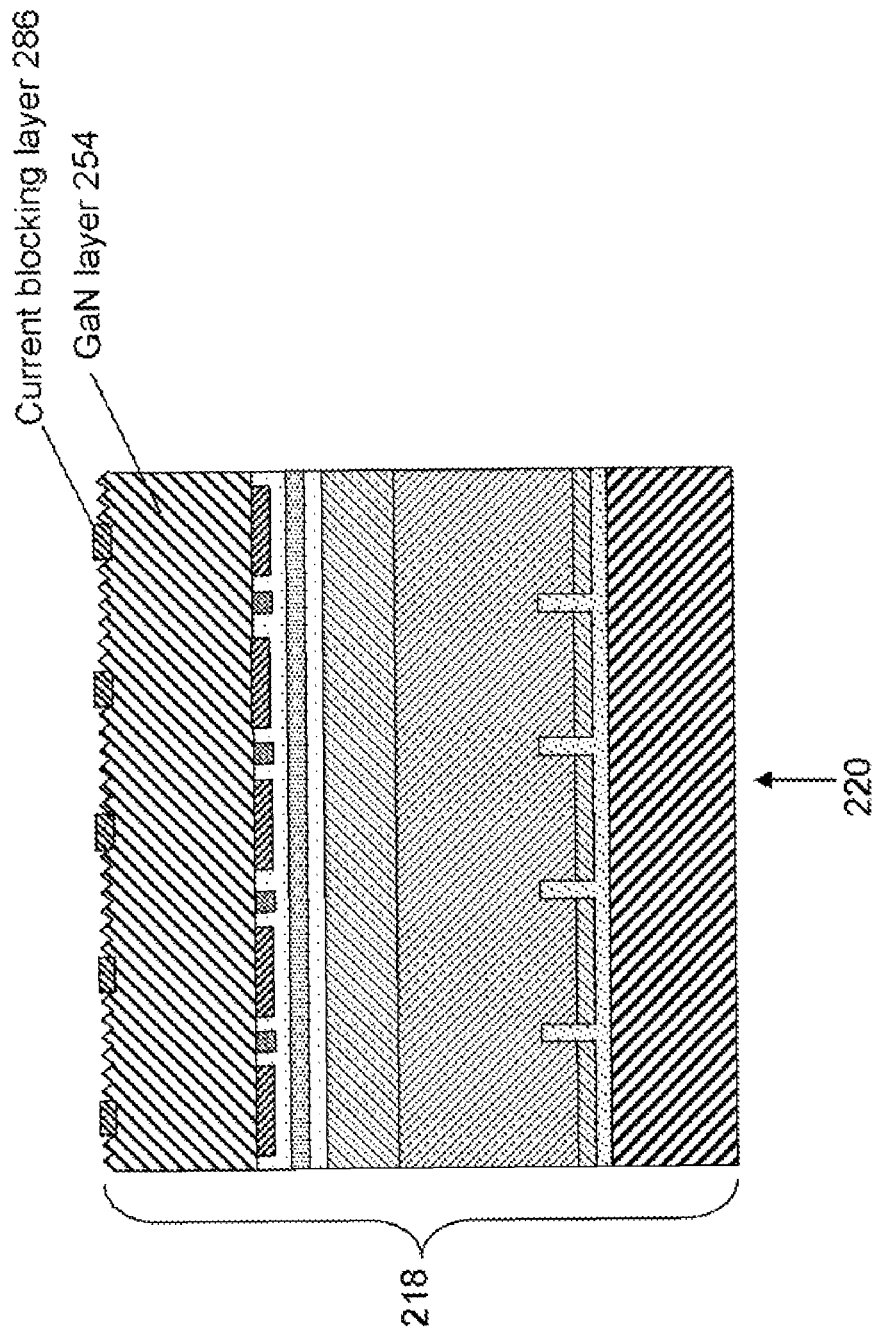
Figure 2L:
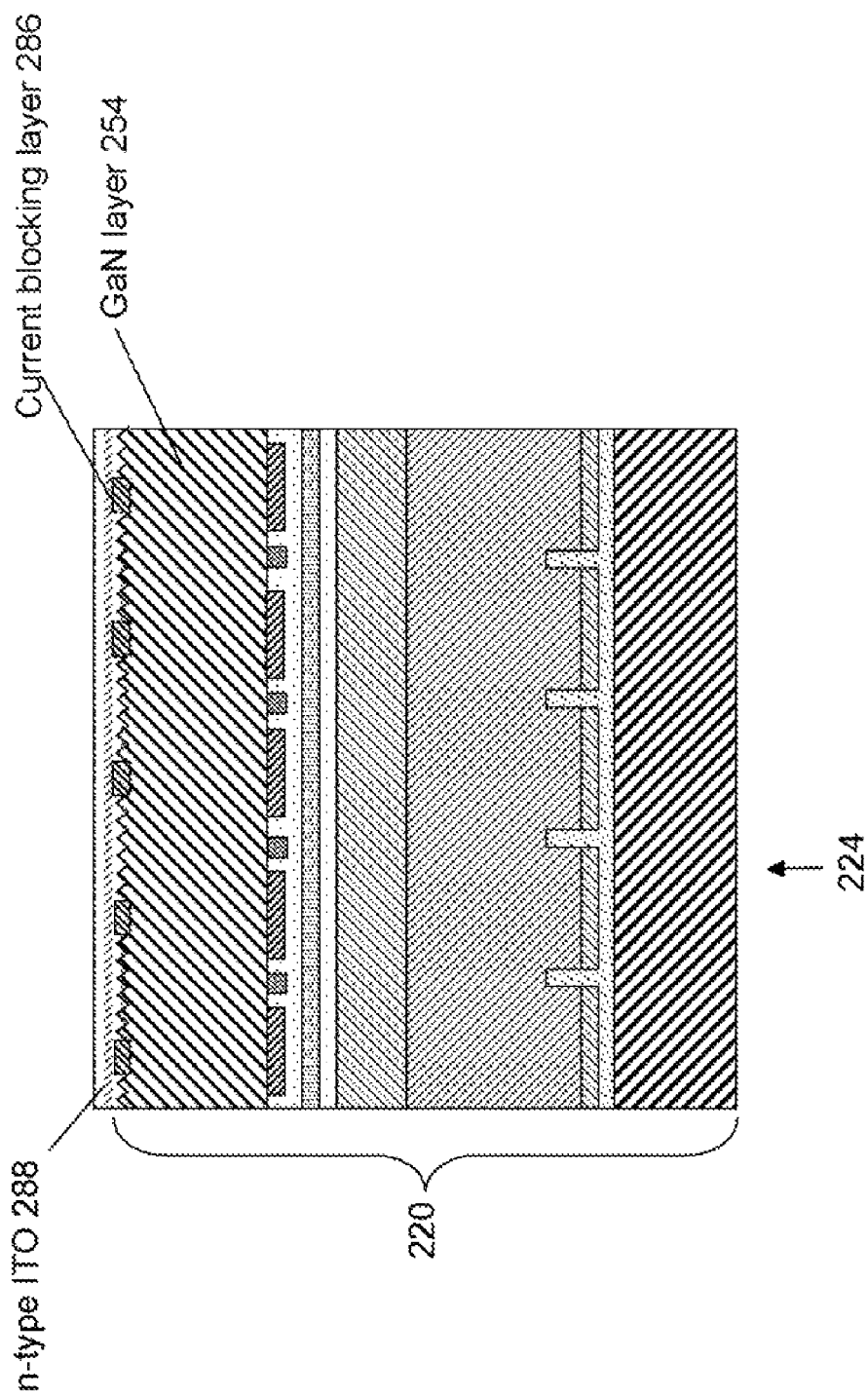
Figure 2M:
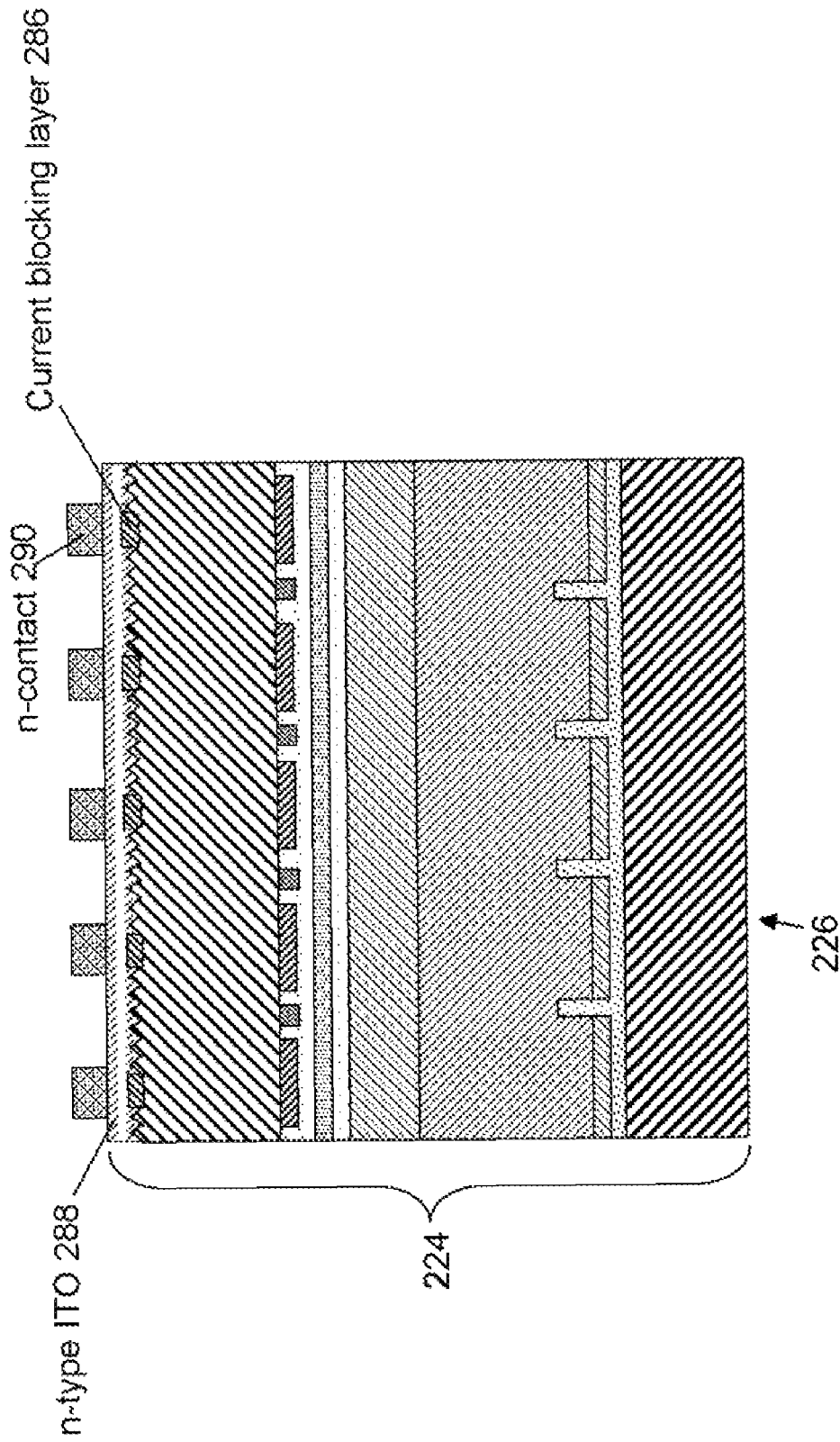
Figure 2N:
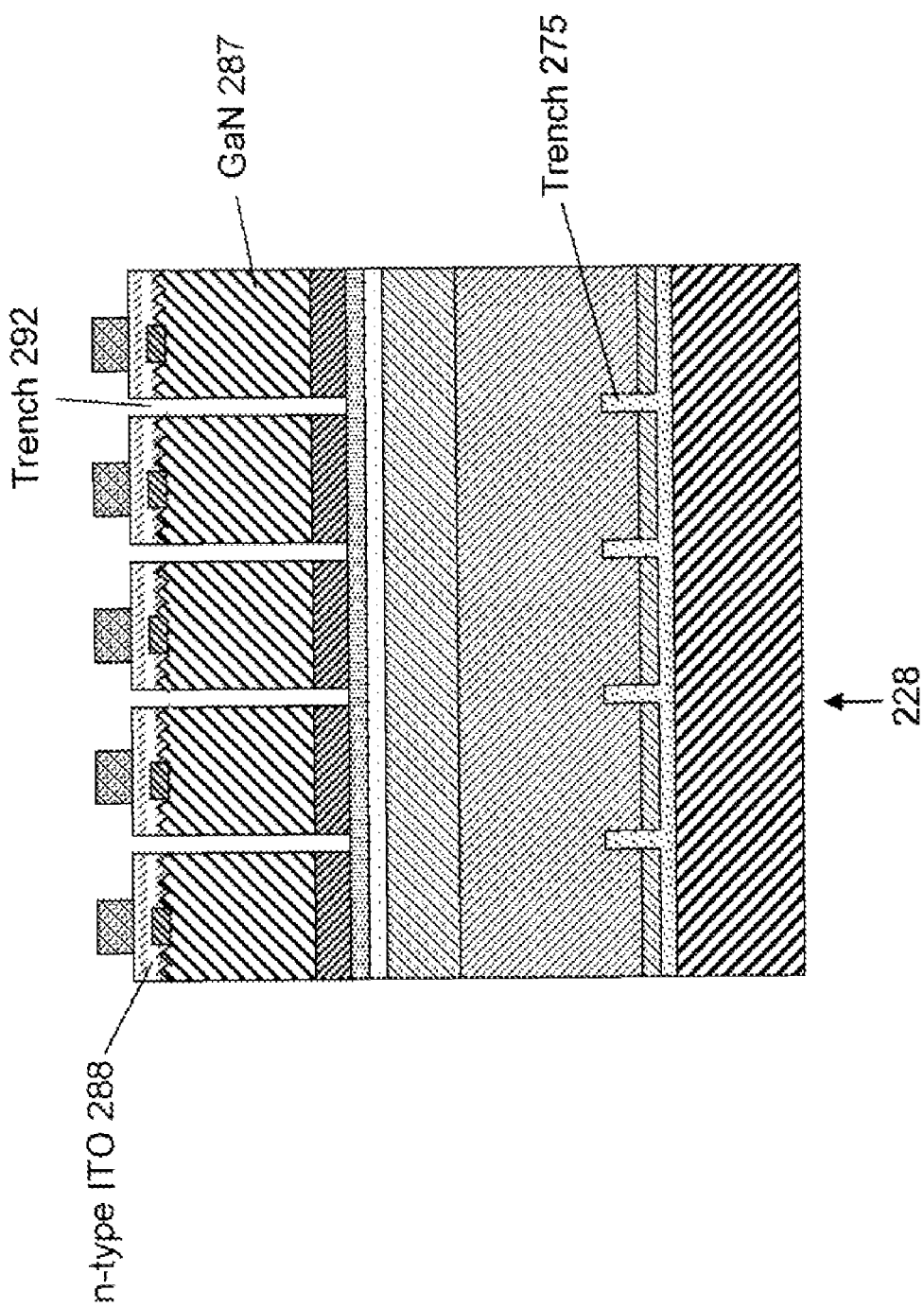
Figure 20:
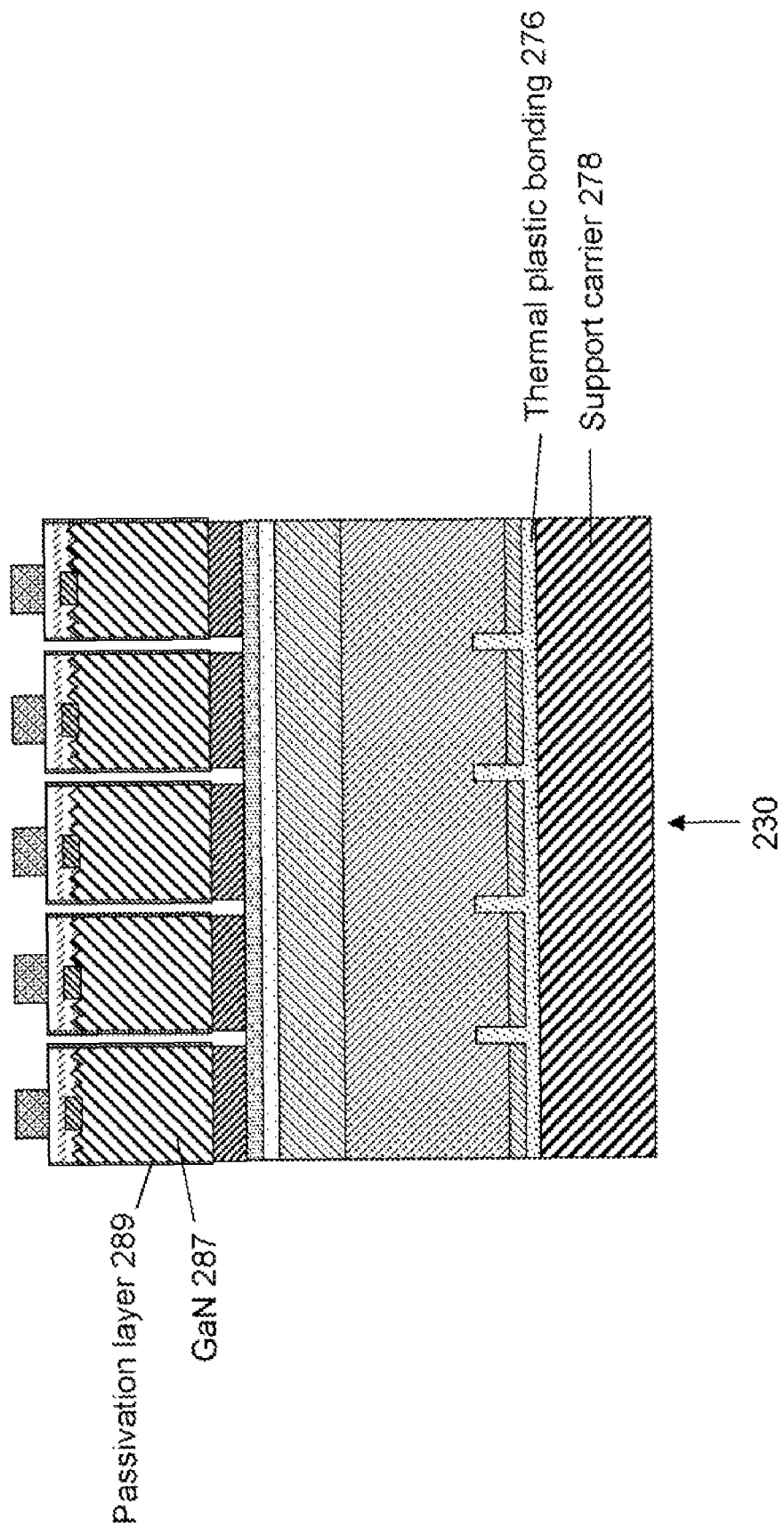
Figure 2P:
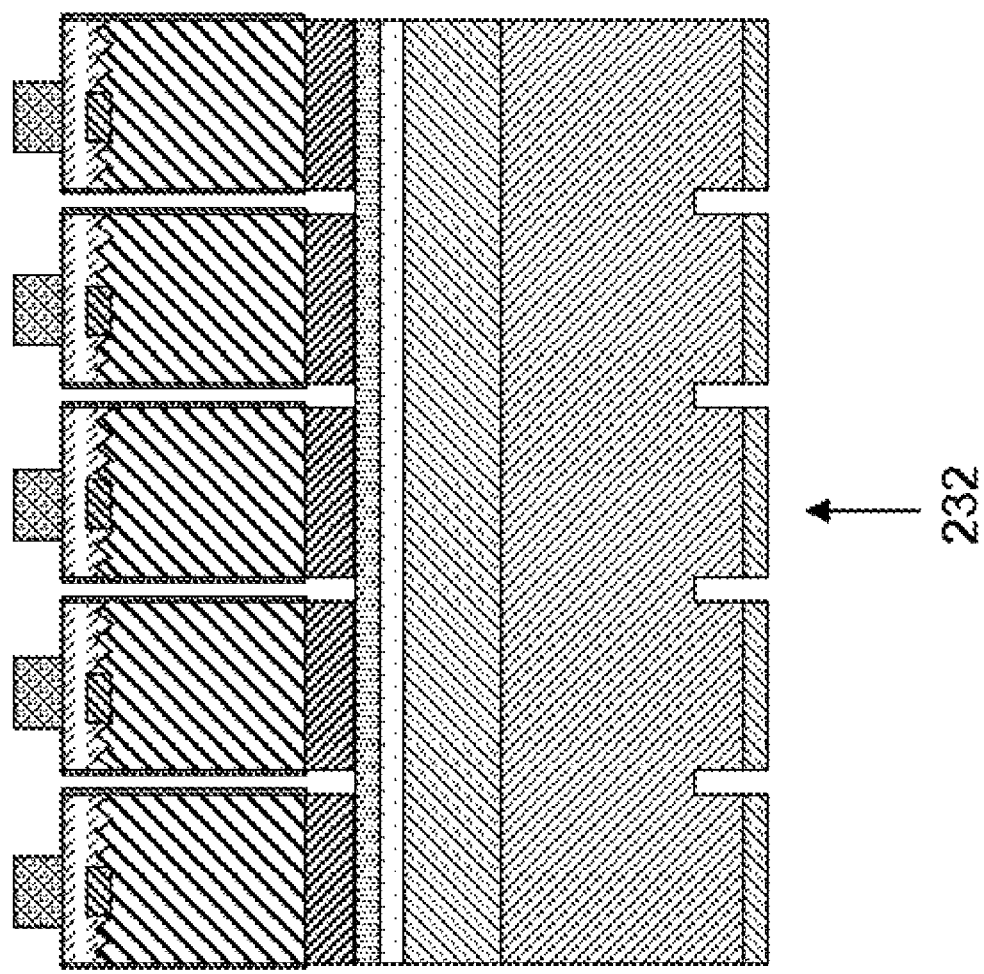
Figure 2Q:
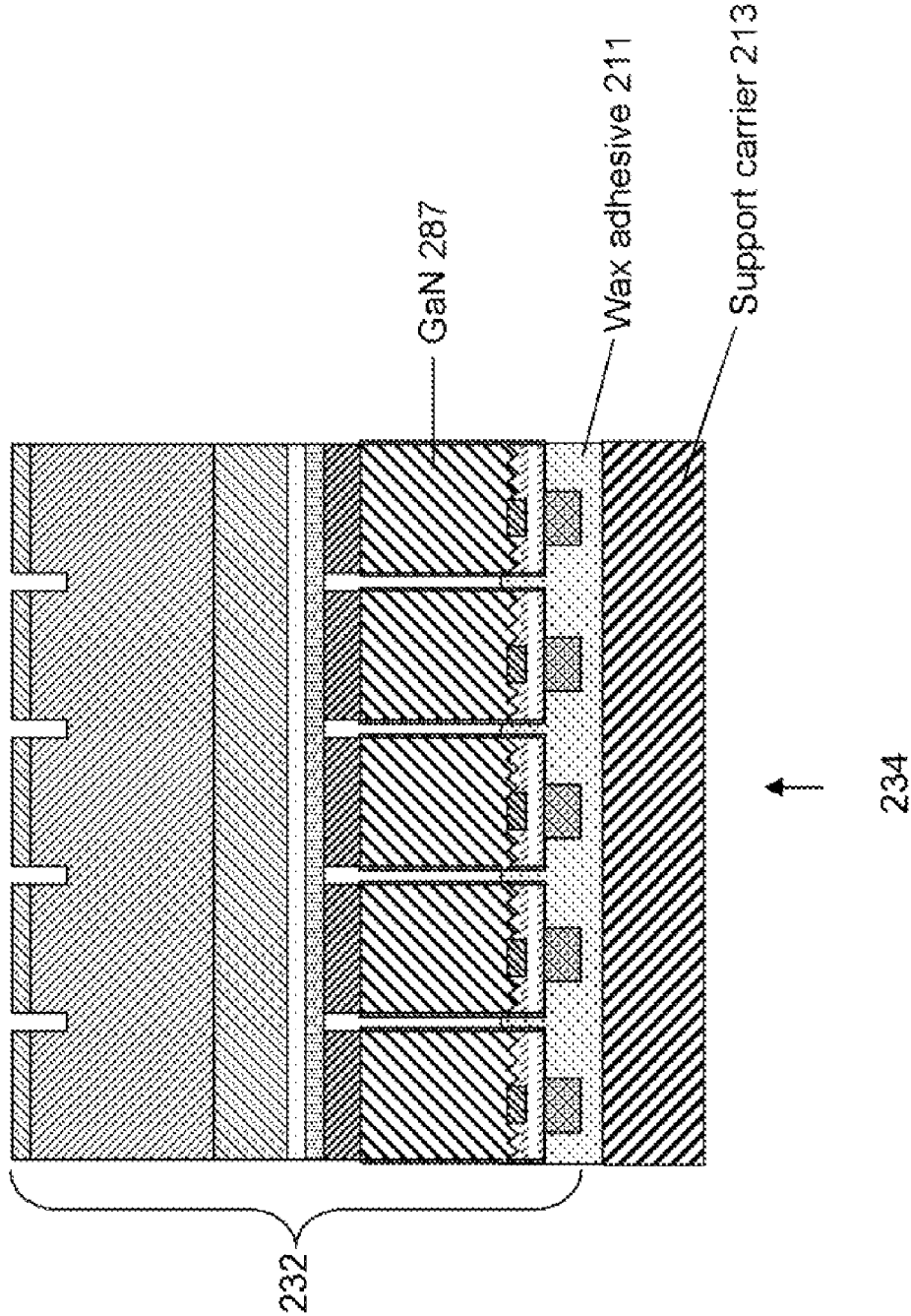
Figure 2R:
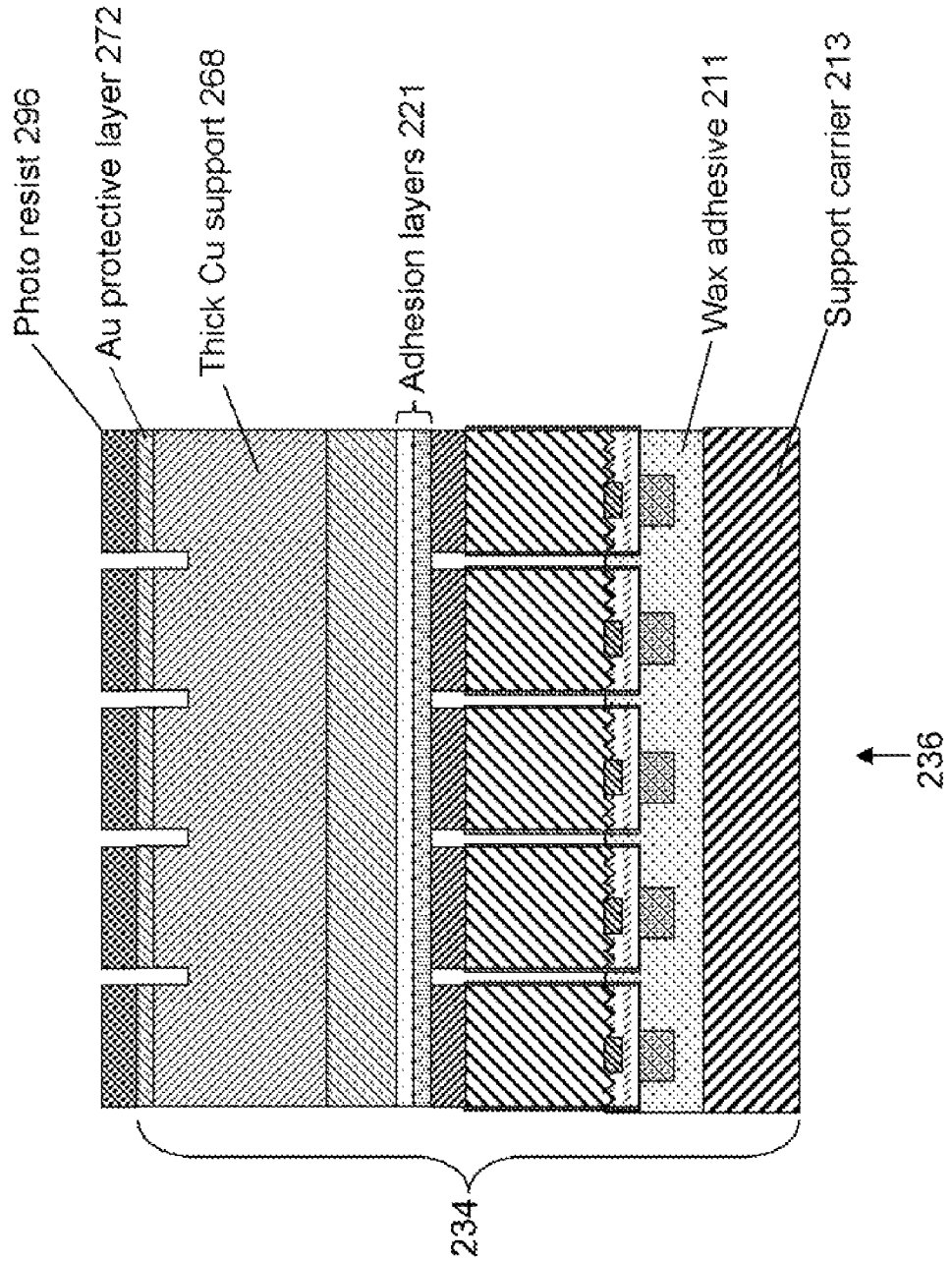
Figure 2S:
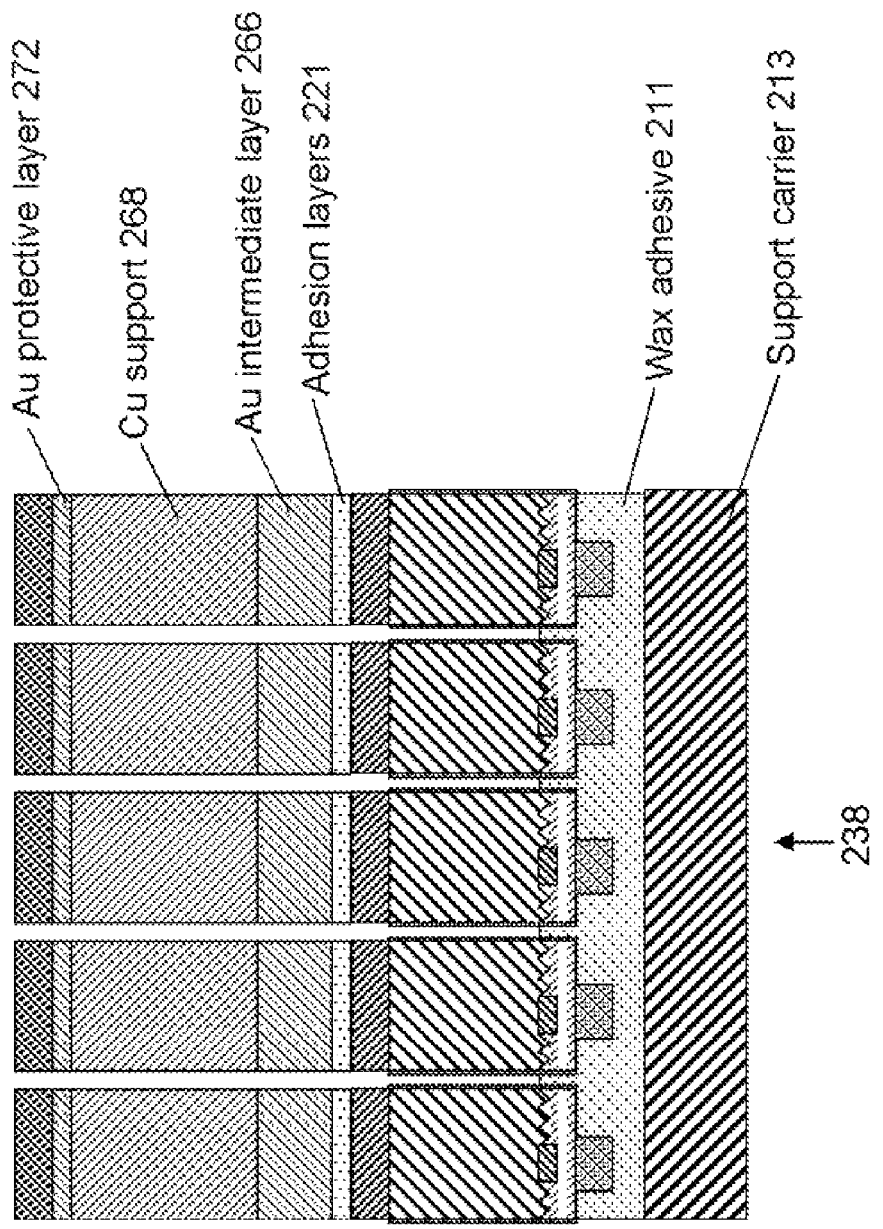
Figure 2T:
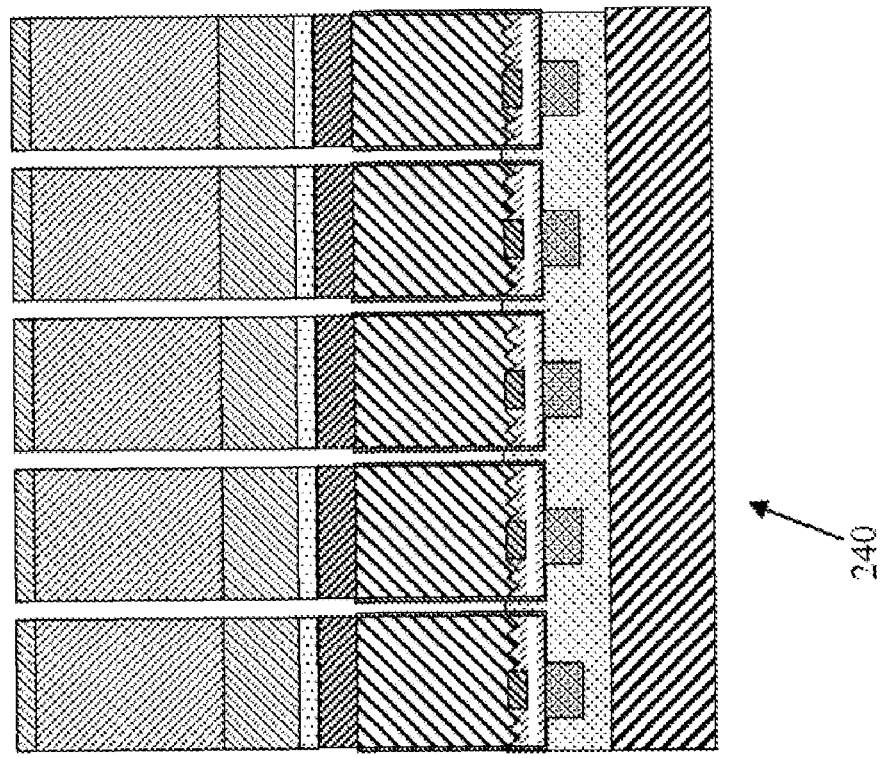
Figure 2U:
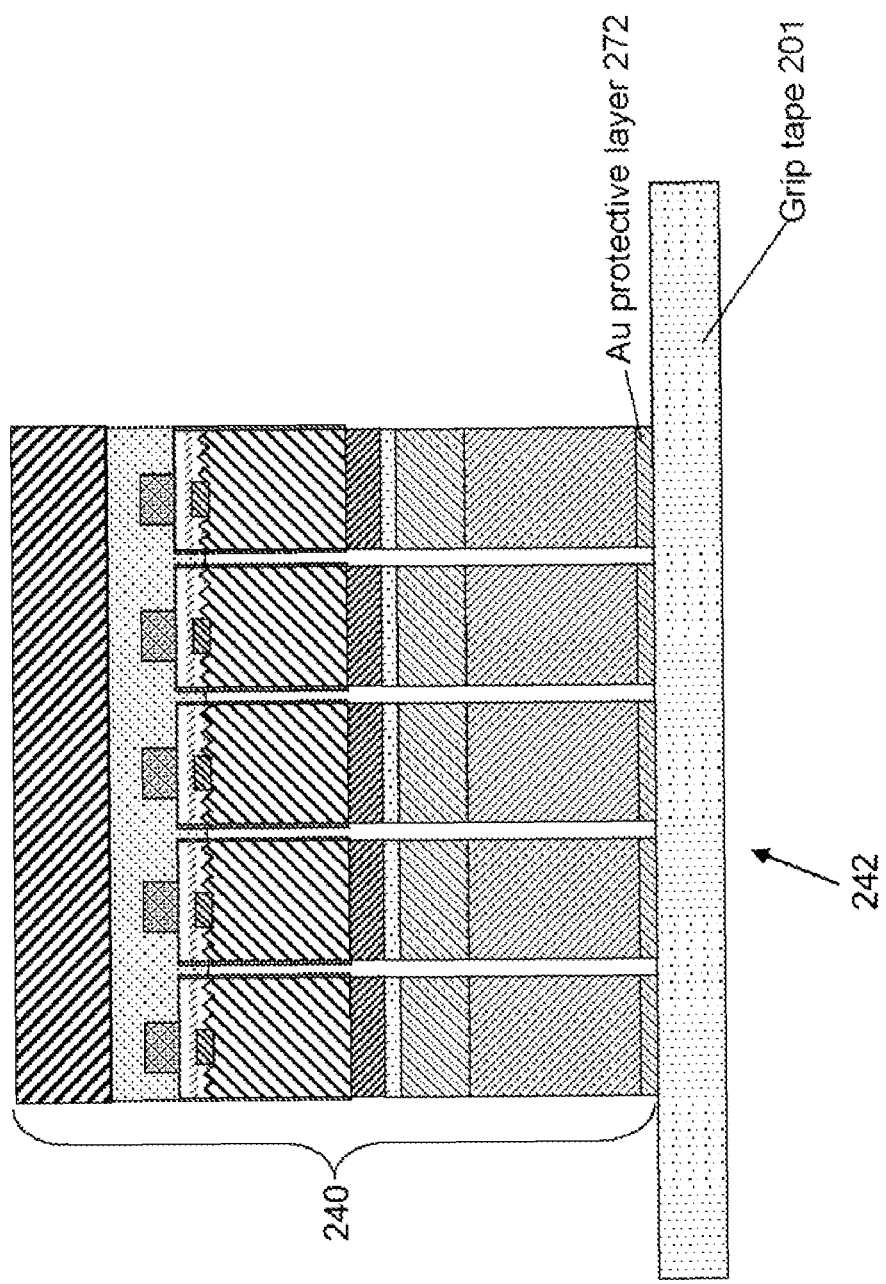
Figure 2V:
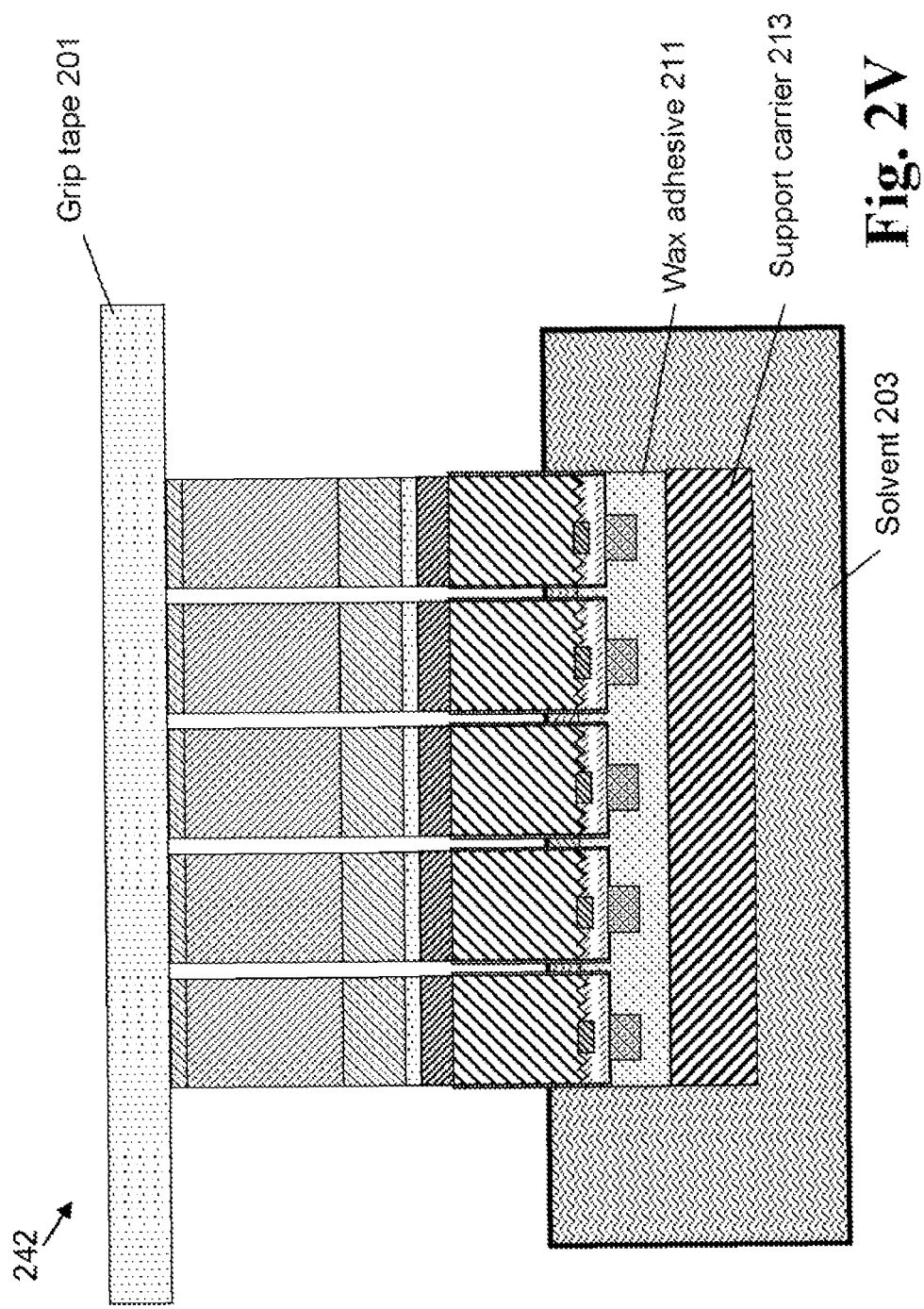
Figure 2W:
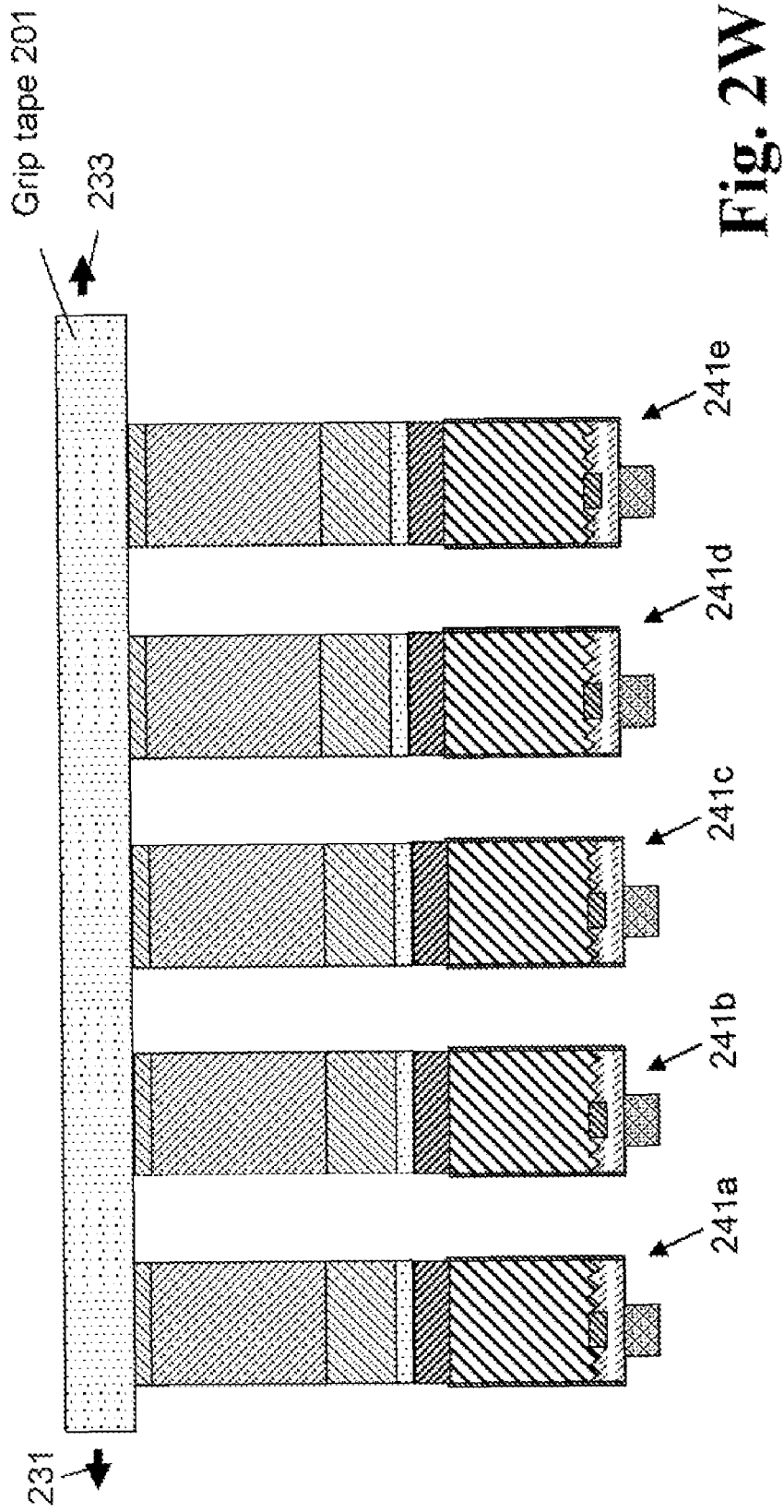

FIGS 2A-W illustrate schematic representations of (partial) cross sectional views of wafer structures resulted from steps in a process fabricating light emitting devices (LEDs) in accordance with one or more embodiments of the present invention. For example, one or more of the structures may be resulted from one or more steps of the method illustrated in the example of FIG. 1.

FIG. 2A illustrates a schematic representation of a (partial) cross sectional view a structure 200 produced in a process of fabricating LEDs in accordance with one or more embodiments of the present invention. Structure 200 may include an epitaxial wafer 250, which may be commercially available from a vendor well known to one of ordinary skill in the art. Epitaxial layer wafer may include a sapphire substrate 252. In one or more embodiments, a Si substrate or SiC substrate may be utilized in place of sapphire substrate 252. Epitaxial layer 250 may also include a semiconductor layer, such as a GaN layer 254, formed on sapphire substrate 252.

GaN layer 254 may include an n-type GaN layer in contact with sapphire substrate 252. GaN layer 254 may also include a p-type GaN layer disposed opposite to the n-type GaN layer. On GaN layer 254, i.e., on the p-type GaN layer, one or more p-metal contacts, such as p-metal contact 258 may be formed, for example, utilizing one or more thin film deposition methods, such as electron-beam physical vapor deposition (EB-PVD) or sputtering. P-metal contact 258 may include one or more layers of Ni, Ag, Pt, Ni, and/or Au, with thicknesses of about 0.5 nm, 1 nm, 10 nm, 120 nm, 30 nm, and/or 30 nm, respectively. P-metal contact 258 may be annealed at about 420° C. for about one minute in $O_2$ with rapid thermal processing (RTP).

In one more embodiments, p-metal contact 258 may include one or more of the following: Ni/Au, PD/Ni/Au, Ni/Pd/Au, PD/Ir/Au, or Pd/Pt/Au. For example, the thin film metal layer thicknesses may be approximately for following: 0.5 nm Ni and 10 nm Au for Ni/Au; 10 nm Pd, 20 nm Ni, and 30 nm Au for Pd/Ni/Au; 10 nm Pd, 20 nm Ir, and 30 nm Au Pd/Ir/Au; 20 nm Ni, 20 nm Pd, 100 nm Au for Ni/Pd/Au; 10 nm Pd, 20 nm Pt, and 30 nm Au for Pd/Pt/Au. In one or more embodiments, p-contact metals may be annealed in the furnace at 500° C. for 2 min in an $O_2$ ambient for Ni containing contacts, while non-Ni containing metal contacts may be annealed in an $N_2$ ambient.

On the p-type GaN layer of the GaN layer 254, one or more passivation layer elements, such as passivation layer element 256, also may be formed between the p-metal contacts. Passivation layer element 256 may include one or more layers of Ti, SiO2, Ti, and Au, with thicknesses of about 10 nm, 200 nm, 10 nm, and 20 nm, respectively. The one or more passivation layer elements may be deposited by plasma enhanced chemical vapor deposition (PECVD) at about 250° C. for about 300 minutes with rapid thermal processing (RTP).

Structure 200 may also include a first adhesion layer 260 formed on GaN layer 254 and covering the one or more p-metal contacts and the one or more passivation layer elements. For example, first adhesion layer 260 may include a Ni layer with a thickness of about 100 nm. Alternatively or additionally, first adhesion layer 260 may include a Pd layer with a thickness of about 100 nm.

On first adhesion layer 260, a second adhesion layer 262 may be formed. Second adhesion layer 262 may include a Ni layer with a thickness of about 200 nm. Alternatively or additionally, second adhesion layer 262 may include an Au layer with a thickness of about 100 nm.

On second adhesion layer 262, a third adhesion layer 264 may be formed. Third adhesion layer 264 may include a Ni layer with a thickness of about 200 nm.

Each of first adhesion layer 260, second adhesion layer 262, third adhesion layer 264 may be formed by EB-PVD or Sputtering and may be annealed at 300° C. for about 1 minute in the air.

On third adhesion layer 264, an Au seed layer/intermediate layer 266 may be formed utilizing EB-PVD. Au intermediate layer 266 may have a thickness of about 500 nm. Au intermediate layer 266 may be utilized for plating a metal support layer.

One or more of adhesion layers 260-264 may be implemented in order to enhance adhesion between the p-metal contacts metal and Au intermediate layer 266.

In one or more embodiments, one or more of adhesion layers 260-264 may be created utilizing in situ Ti or Cr deposited onto p-metal contacts (or a p-metal contact thin film) utilizing an electron beam evaporator. To fabricate a vertical structure device having a very this (e.g., less than 5 μm), hard GaN layer, e.g., GaN layer 254, with a thick (~50 μm) and soft metal film support, it may be useful to form an intermediate layer, such as Au intermediate layer 266, in between the GaN layer and the metal support layer to reduce compressive stress buildup at the interface between the GaN layer and the metal support layer. In one or more embodiments, Au intermediate layer 266 with an approximately 0.5~1 μm thickness may be deposited consecutively on the Ti or Cr surface utilizing the electron beam evaporator without removing wafers from the vacuum chamber. In situ consecutive layer deposition may be useful to prevent the oxidation or contaminations, which may be useful to make a good thin film adhesion between Ti or Cr and Au layers.

FIG. 2B illustrates a structure 202 formed by plating (e.g., electroplating) a thick Cu support 268 on Au intermediate layer 266 of structure 200 illustrated in the example of FIG. 2A. Cu support 268 may have a thickness greater than 50 μm. Cu support 268 may include one or more layers. A portion of Cu support 268 in contact with Au intermediate layer 266 may be a soft Cu layer configured for reducing stress buildup. A portion of Cu support 268 that is farther from Au intermediate layer 266 may be a hard Cu layer having a higher hardness in order to provide structural robustness.

In one or more embodiments, electroplating or electro-less plating may be utilized for forming Cu support 268 as fast and inexpensive deposition methods compared to the other deposition methods. This is particularly useful for mass production of vertical light devices in terms of cost effectiveness. Cu support 268 may provide a connective layer with good rigid mechanical support for GaN layer 254, and may provide good electrical conductivity and heat dissipation. In order to meet these requirements, graded Cu alloy layers may be deposited on a Au/Cr or Au/Ti adhesion layer.

In one or more embodiments, two Cu layers may be deposited, which include a Cu strike layer prior to a Cu alloy layer in order to promote good adhesion between the thin vacuum evaporated Au layer and the Cu alloy layer. Initially, a sulfate-based soft copper layer is plated in order to gradually soften stress build up due to the thick metal layer deposition. The initial soft Cu layer thickness is set up to ~10 μm. The plating rate is set up to 3~5 μm/hour to form a dense and uniform Cu plating layer. Another reason to choose a slow plating rate is to prevent wafer bowing after de-bonding the wafer from the support wafer carrier. Due to the compressive stress build up at the interface between the GaN layer 254 and the Cu support 268, the wafer tends to bow after de-bonding the wafer from the support carrier. In addition to the slow rate plating, organic-base additives are added in the electroplating solution and the sulphonate-base plating solution is utilized. Furthermore, the electroplating is performed at low temperature (e.g., 5°0 C.) to minimize stress build up.

In one or more embodiments, next to the soft Cu layer, a hard Cu layer is plated in order to provide structural stiffness. The plating rate of hard Cu plating is around 15 μm/hour. For the Cu alloy plating, the metal alloy plating solutions containing tin (Sn) and iron (Fe) are mixed with the Cu sulfate solution to improve the mechanical strength and the electrical conductivity of the Cu support layer. The total thickness of the Cu alloy support layer is 50~60 μm.

After the thick Cu metal support is formed by plating (e.g., electroplating), the surface of sapphire substrate 262 may be treated. This may include mechanical polishing to create a uniform roughness of the sapphire surface. The sapphire surface roughness is useful to control the laser beam energy density and the final surface morphology of laser lifted GaN surface. The laser beam energy density is strongly dependent on the surface roughness of the sapphire surface. Low laser beam energy is utilized if the rough sapphire surface is utilized for the laser lift-off (LLO) process. However, if the surface is rough, the laser lifted surface looks rough since the surface morphology replicates to the GaN surface after laser lift-off. On the other hand, if a polished surface is utilized, higher laser beam energy is utilized. The surface morphology of laser lifted GaN surface is similar to that of polished sapphire surface. However, a higher laser beam usually results in crack generation due to excessive laser beam energy. To obtain a good laser lift-off result and the GaN surface morphology, the surface roughness of the sapphire surface is chosen to be approximately 10~20 angstrom in RMS (root mean square) value.

FIG. 2C illustrates a structure 204 formed by performing chemical mechanical polishing (CMP) on surface 270 of Cu support 268 of structure 202 illustrated in the example of FIG. 2B. The CMP is performed such that surface 270 may be sufficiently smooth for photo lithography and for providing desirable thermal contact with a packaging part, such as a heat sink or lead frame, in a packaged device. Another purpose of CMP may be to produce a uniform thickness for consecutive semiconductor processing and a uniform device thickness. A uniform thickness may be crucial to obtain the high device separation yield after chemical device separation.

FIG. 2D illustrates a structure 206 formed by plating (e.g., electroplating) an Au protective layer 272 on Cu support layer 268 of structure 204 illustrated in the example of FIG. 2C. Au protective layer 272 may have a thickness less than 3 µm. Au protective layer 272 may be configured to protect Cu support 268 from oxidation. Au protective layer 272 may also be configured to provide bonding for assembly, thereby providing desirable thermal contact with a lead frame or heat sink. Au protective layer 272 may be useful to promote a good adhesion between the individual die and conductive epoxy utilized during the die bonding and wire bonding process for the packaging of the LEDs. Au protective layer 272 may also form electrodes (e.g., anodes) of LEDs.

FIG. 2E illustrates a structure 208 formed by spin coating one or more photoresists, such as photo resist 274, on Au protective layer 272 of structure 206 illustrated in the example of FIG. 2D. The one or more photoresists may be configured for patterning Au layer 272 and Cu support layer 268 for subsequent etching.

FIG. 2F illustrates a structure 210 formed by etching Au protective layer 272 and Cu support 268 of structure 208 illustrated in the example of FIG. 2E. As a result, one or more trenches, such as trench 275, may be formed. The depth of trench 275 may be about 1 to 2 µm. Au protective layer 272 may be etched utilizing a KI solution. Cu support 268 may be etched utilizing a solution containing one or more of cupric chloride ($CuCl_2$), hydrochloric (HCl), and hydrogen peroxide ($H_2O_2$).

FIG. 2G illustrates a structure 212 formed by implementing thermal plastic bonding 276 on the etched Au protective layer 272 and the etched Cu support 268 of structure 210 illustrated in the example of FIG. 2E and attaching a support carrier 278 using thermal plastic bonding 276. Thermal plastic bonding 276 may represent a high temperature adhesive for temporary bonding. Thermal plastic bonding 276 may be formed on the etched Au layer 272 and Cu support 268 by spin coating, curing, and/or high temperature pressing. Support carrier 278 may be formed of one or more of sapphire and quartz and may be transparent. Support carrier 278 may maintain flatness of the etched Au protective layer 272 and the etched Cu support 268 in subsequent process steps.

In one or more embodiments, support carrier 278 may be constructed from stainless steel with small holes. There may be two reasons to use a metal wafer carrier. First, it may be useful to maintain flatness of the GaN epitaxial wafer after laser lift-off since a very thin epitaxial layer attached to a thick metal substrate tends to bow after sapphire substrate removal, which creates great difficulties in consecutive processing of the laser lifted wafer, such as mask align, dry etching, thin film deposition, and wafer probing. Second, it provides good electrical and heat conduction during the wafer probing and die isolation etching processes. By utilizing the metal wafer carrier, there may be no need to remove wafer from the carrier for post processing. In addition, the perforated wafer carrier provides bubble-free wafer bonding since air bubbles can escape easily through the holes during the bonding process. It also promotes an easy de-bonding process between the Sapphire/GaN/Cu/Au wafer and the wafer carrier since the solvent can penetrate easily through the holes during de-bonding process. By utilizing the perforated wafer carrier, the entire process may be easy and reliable, which leads to high fabrication yield for the fabrication of the vertical devices. In one example, the thickness of the wafer carrier 278 may be 1/16 inches and the diameter may be 2.5 inches. The total number of holes may be 21 and the through hole diameter may be 20/1000 inches. The wafer carrier surface may be electro-polished to create a mirror like flat surface for the uniform bonding with the adhesive and for maintaining wafer flatness.

Silver-based conductive adhesives may be utilized to bond the Sapphire/GaN/Cu/Au and the perforated wafer carrier. The conductive adhesive may be utilized to provide good electrical and thermal conduction for the wafer probing and die isolation etching process. In the exemplary embodiment, silver-based conductive thermo-plastic epoxy adhesives may be utilized. The thermo-plastic epoxy may be known to have excellent adhesion strength and good heat resistance. Another advantage of the thermo-plastic epoxy may be that it can be dissolved in the solvent, such as acetone, which may be useful for a de-bonding process.

In one or more embodiment, sheet-type thermo-plastic epoxy may be employed because the film thickness of the sheet type thermo-plastic epoxy may be more uniform than that of liquid-based adhesives. The liquid-based adhesives often result in uneven thickness uniformity and bubble formation in the previous bonding process experiences since the spin coating of the liquid-base adhesives generally leads to thicker film formation in the wafer fringe side than that of center area of the wafer. This may be quite common phenomena for the liquid-base adhesives to obtain thick adhesive layers by multiple spinning. For the bonding of thermo-plastic epoxy, a 127 µm-thick sheet-type thermo-plastic epoxy may be sandwiched between thick metal support 268, 272 and perforated wafer carrier 278. The pressure may be set at 10~15 psi and the temperature may be maintained at below 200° C. in a hot iso-static press. The bonding time may be less that 1 minute. This short bonding time has an advantage over to that of liquid-based adhesives, which typically require more than 6 hours of curing time for the complete curing of the adhesive. The short bonding process time also greatly enhance the productivity of the LED fabrication.

FIG. 2H illustrates a structure 216 formed by removing sapphire substrate 252 from structure 212 illustrated in the example of FIG. 2G utilizing a laser lift-off process. Excimer laser 281 that may be transparent to sapphire substrate 252 may be utilized to shoot through sapphire substrate 252 and may be absorbed by GaN layer 254. As a result, at the interface of GaN layer 254 and sapphire substrate 252, GaN may be decomposed into Ga and $N_2$. $N_2$ may evaporate and liquid Ga may drop from GaN layer 254 as Ga drops, such as Ga drop 280. As a result, sapphire substrate 252 may slide away from structure 216.

In one or more embodiments, a 248 nm KrF ultra violet (UV) excimer laser (pulse duration of 38 ns) may be utilized for laser lift-off. A reason for choosing this wavelength may be that the laser should beneficially transmit through the sapphire but be absorbed in the GaN epitaxial layer in order to decompose the GaN into metallic Ga and gaseous nitrogen ($N_2$) at the GaN/sapphire interface. The laser beam size may be chosen as a 7 mm×7 mm square beam or as big as 12 mm×12 mm and has beam power density between 600~1,200 mJ/cm$^2$. It may also be suggested that the laser beam energy density may be dependent on the surface roughness of the sapphire substrate surface. In order to obtain smooth GaN surface after laser lift-off, the beam energy higher than 700 mJ/cm$^2$ may be utilized for the mechanically polished sapphire substrate 10~20 angstrom in RMS (root mean square) value.

Surface roughness of the sapphire substrate may be an important process parameter for obtaining a smooth GaN surface after laser lift-off. If un-polished sapphire surface may be utilized during laser lift-off, the GaN surface may be rough, which results in poor light output of the LED due to poor reflectivity of the rough surface after forming a final device. However, if a polished surface may be utilized, a smooth GaN surface can be obtained, hence higher light output can be obtained. However, since the laser beam may be localized on the polished sapphire surface, the area irradiated with the higher laser beam power may result in cracking on the GaN surface compared to the area with less laser beam energy. Therefore, it may be useful to choose an optimal surface roughness of sapphire wafer in order to obtain a high yield laser lift-off process and a high device performance at the same time. According to conventional techniques, sand blasting may be commonly utilized to obtain uniform laser beam distribution on the polished sapphire surface, however, sand blasting may be unreliable and unrepeatable to obtain the identical surface roughness consistently. In the invention, a diffusing media constructed from materials transparent to the 248 nm UV laser may be placed in between laser beam and sapphire substrate to obtain uniform laser beam energy distribution on the sapphire surface, hence to enhance the laser lift-off process yield. The RMS (root mean square) surface roughness of the diffusing media may be set up less that 30 μm and sapphire was utilized for the diffuser.

After laser lift-off, excess Ga drops, e.g., Ga drop 280, result from GaN decomposition during laser lift-off, and may be cleaned with an HCl solution (HCl: $H_2O$=1:1, at room temperature) or boiled utilizing HCl vapor for 30 seconds. Since the Ga melts at room temperature, Ga may be formed in a liquid state during the laser lift-off; hence it can be cleaned with chlorine-based acidic solutions.

FIG. 2I illustrates structure 216 with a surface 282 of GaN layer 254 cleaned, for example, utilizing the aforementioned HCl solution for removing Ga drops. Surface 282 may also be smoothened by dry etching.

In one or more embodiments, in order to expose the n-type GaN layer of GaN layer 254, any buffer layers (e.g. GaN, AlN, InN, InGaN and AlGaN) may be removed by dry etching, beneficially utilizing inductively coupled reactive ion etching (ICP RIE). The exposed n-GaN surface may be further etched to make an atomically flat surface, ICP polishing may be also performed on the n-GaN surface. Obtaining a smooth and flat n-GaN surface may be particularly useful to form a low resistance metal contact. It may be useful to note that the chlorine-based gas mixture in the ICP RIE process particularly effective to produce flat n-GaN surface morphology. The ICP etch conditions for this surface smoothening process may be as follows:

Total flow rate: 100 sccm
Intensity of magnet field: 15 gauss
Substrate temperature: 70° C.
Gas mixture: 100% $Cl_2$
Power/bias voltage: 600W/−300V
Operational pressure: 30 mTorr The resulting surface roughness after ICP polishing may be less than 10 angstrom in RMS value.

FIG. 2J illustrates a structure 218 formed by texturing a surface of GaN layer 254 such that structure 218 may include a textured n-type GaN surface 284. The texturing may be performed for optimizing photon escape angles on the surface of GaN layer 254, in order to increase light extraction efficiency. The texturing may be performed by chemical wet etching utilizing one or more OH-based chemicals, such as KOH. Alternatively or additionally, the texturing may be performed by dry etching. During the texturing, one or more photo resists may be disposed on one or more locations, such as location 285, for masking the one or more locations. The one or more locations may not be textured in order for subsequent formation of current blocking layer elements (CBL elements).

In one or more embodiments, the surface of GaN layer 254 may be etched to form a spherical lens-shaped surface morphology. Due to differences in reflective index between GaN and air, photons generated from the GaN semiconductor active layer reflect back to the semiconductor material if the GaN surface may be flat. This internal reflection results in poor light extraction, and may reduce the light output of the device even though plenty of photons may be generated in the semiconductor active layer. Therefore, it may be beneficial to fabricate the GaN surface with a textured surface morphology in order to reduce the escaping angle of photons by the Snell's law. A spherical lens shape may be known to be the most effective over to the other surface textured morphology. ICP RIE may be effectively utilized to fabricate the spherical lens of the GaN surface by modulating etch conditions. The feature size of the spherical lens may be approximately ~5 μm in diameter after ICP etching. The ICP etch conditions for the surface texturing process may be as follows:

Total flow rate: 100 sccm
Intensity of magnet field: 15 gauss
Substrate temperature: 70° C.
Gas mixture: 30% $BCl_3$/60% $Cl_2$/10% Ar
Power/bias voltage: 600W/−300V
Operational pressure: 30 mTorr It may be further useful that the contact area of n-GaN surface to form a good metal contact. A 6 μm-thick photoresist (PR) film may be utilized to mask the n-contact area prior to the ICP etching. The PR mask may be removed after the ICP etching with PR remover or acetone.

FIG. 2K illustrates structure 220 formed by forming one or more current blocking layer elements (CBL elements), such as CBL element 286, on GaN layer 254 of structure 218 illustrated in the example of FIG. 2J. CBL element 286 may be formed of $SiO_2$ with a thickness of about 200 nm. CBL element 286 may be deposited with PECVD and/or EB-PVD at about 250° C. for about 30 minutes and may be annealed at about 300° C. for about 3 minutes with RTP.

FIG. 2L illustrates a structure 224 formed by forming an n-type current spreading layer, e.g., n-type ITO (Indium Tin Oxide) layer 288, on CBL elements and GaN layer 254 of structure 220 illustrated in the example of FIG. 2K. In one or more embodiments, the configuration of GaN layer 254 of structure 220 has an exposed n-type GaN layer for enabling implementation of n-type ITO layer 288.

The removal of sapphire substrate 252, illustrated in the example of FIG. 2H, may enable utilization of n-type ITO layer 288. In the prior art, an n-type GaN layer may be attached to a sapphire substrate, SiC substrate, or Si substrate. As a result, prior art LED may only utilize a p-type ITO layer, which may typically have inferior current spreading capability compared with an n-type ITO layer.

In general, an n-type ITO (having Si dopants) may have a significantly higher concentration of conductive dopants than a p-type ITO (e.g., having Mg dopants) utilized in the prior art. The higher dopant concentration may result in much more effective current spreading across the ITO layer. Advantageously, higher lighting efficiency and/or lower power consumption may be provided.

N-type ITO layer 288 may be deposited with sputter deposition and may be annealed at about 350° C. for about 3 minutes with RTP. N-type ITO layer 288 may have a thickness of about 200 nm. N-type ITO layer 288 may have a low resistivity (such as in the low $10^{-4}$ Ohm-cm) and may have more than 90% transmittance.

In one or more embodiments, the composition of n-type ITO layer 288 may be 10 wt % $SnO_2$/90 wt % $In_2O_3$. The thickness n-type ITO layer 288 may be about 75~200 nm. N-type ITO layer 288 may be deposited utilizing an electron beam evaporator or sputtering system at room temperature. Annealing may be carried out after the ITO film deposition in a tube furnace with $N_2$ ambient for 5 minutes. The annealing temperatures may be varied in between 300° C. to 500° C. The minimum resistivity of the ITO film may be about low $10^{-4}$ Ωcm at 350° C. of annealing temperature in $N_2$ ambient. The transmittances at 460 nm may be over 95% at the same annealing temperature.

FIG. 2M illustrates structure 226 formed by implementing one or more n-contacts (or cathodes), such as cathode/n-contact 290, on n-type ITO layer 288 of structure 224 illustrated in the example of FIG. 2L. N-contact 290 may have a greater dimension, such as diameter, than CBL element 286. For example, if n-contact 290 has a diameter of about 90 μm, CBL element 286 may have a diameter of about 70 μm. N-contact 290 may include one or more of Ti and Au layers with thicknesses of about 300 nm and about 2,000 nm, respectively. N-contact 290 may be deposited on n-type ITO layer 288 with EB-PVD and may be annealed at about 250° C. for about 5 minutes with RTP.

In one or more embodiments, n-contact 290 may be formed of one or more materials including one or more of Ti and Al. The thicknesses of n-contact metals may be 5 nm for Ti, and 200 nm for Al, respectively. In order to make a good adhesion between the n-contact metal layer and the pad metal, 20 nm Cr may be deposited on the Al as an adhesion layer. For the pad metal deposition, 1 μm-thick gold may be deposited on the Cr consecutively in the electron beam evaporation chamber without breaking vacuum. In order to form an ohmic contact, the n-contact metal may be annealed in the furnace at about 250° C. for about 10 minutes in a $N_2$ ambient atmosphere.

In one or more embodiments, n-contact 290 may be formed at the corner of the corresponding device (LED) instead of the center of the device. Usually, metal contacts may be formed at the center in case of vertical structure device since center contact may be the most efficient current path due to its symmetric location. However, contrary to conventional vertical structure devices, it may be possible to form a contact at the corner of the device in this new vertical structure device because of the ITO transparent contact already formed underneath the n-metal contact. By placing a metal contact at the corner, there may be no shadowing effect from the bonding pad and bond wires after device packaging, which may be the case when an opaque metal contact may be located at the center of the device. Therefore, higher light output can be obtained with this new device design.

FIG. 2N illustrates a structure 228 formed by etching structure 224 illustrated in the example of FIG. 2M from a surface of n-type ITO layer 288 down to/through p-metal contact 258 in a GaN die isolation etching process. The etching may be performed utilizing dry etching. As a result, one or more trenches, such as trench 292, on the device side (i.e., the GaN element side) may be formed, to separate GaN elements, e.g., GaN element 287, for individual LEDs/devices. The one or more trenches (including trench 292) on the device side may be substantially aligned with the one or more trenches (including trench 275) on the protective-support-layer side.

In one or more embodiments, the individual devices may be isolated by a magnetized inductively coupled plasma (MICP) dray etching technique. MICP can accelerate the etch rate compared with the other dry etching methods. This may be particularly useful to prevent photoresist burning during the etch process. MICP provides about twice the etch rate compared to conventional ICP. Fast etch rate may be suggested for the processing of the vertical devices having metal support since the metal substrate can be attacked by chemicals designed for removing metal or oxide masks. Therefore, in order to use the photo-resist mask for the die isolation etching, fast etching technique may be useful. The isolation trench dimension may be less than 50 μm wide and deeper than 3.0 μm deep. MICP dry etch conditions for device isolation may be as follow:

Total flow rate: 100 sccm
Intensity of magnet field: 15 gauss
Substrate temperature: 70° C.
Gas mixture: 40% BCl3/40% Cl2/20% Ar
Power/bias voltage: 600W/−300V
Operational pressure: 30 mTorr
Etch depth: >3.0 μm
Etch mask: Photo-resist (AZ 9262) (thickness: 24 μm)

FIG. 2O illustrates a structure 230 formed by implementing passivation layers, such as passivation layer 289, for protecting isolated GaN devices (or dies), such as GaN element 287. Passivation layer 289 may be formed of $SiO_2$.

In one or more embodiments, passivation layer 289 may be deposited in order to protect device from the external hazardous environment and to increase the light output by modulating reflective index between the passivation layer and the GaN. In one aspect, the GaN element may be passivated with $SiO_2$ thin film. The film may be deposited with PECVD at about 250° C. The film thickness may be maintained at about 80 nm for an optimal reflective index and transparency.

FIG. 2P illustrates a structure 232 formed by removing support carrier 278 and thermal plastic bonding 276 from structure 230 illustrated in the example of FIG. 2O in a support carrier de-bonding process. Support carrier 278 and thermal plastic bounding 276 may be removed by immersed structure 230 or at least part of structure 230 in a solvent (with selectivity) such that thermal plastic bonding 276 may be dissolved. According, support carrier 278 may be removed. De-bonding process consists of placing bonded wafer on hot plate at about 250-280° C. then sliding off and peeling off wafer from carrier. Residual thermal plastic is immersed into heated acetone or N-methyl pyrrolidon (NMP) bath at 150° C.

FIG. 2Q illustrates a structure 234 formed by attaching the device side (i.e., the GaN element side) of structure 232 illustrated in the example of FIG. 2P to a support carrier 213 utilizing a wax adhesive 211. Support carrier 213 may be configured to stabilize (and maintain integrity and separation of) individual devices during subsequent process steps, such as etching the protective and support layers.

FIG. 2R illustrates a structure 236 formed by spin coating one or more photoresists, such as photoresist 296, on the previously etched Au protective layer 272 of structure 234 illustrated in the example of FIG. 2Q. The one or more photoresists may be utilized for patterning the previously etched Au layer 272 and Cu support 268 through photo lighography for subsequent further etching of the previously etched Au layer 272 and Cu support 268. Alternatively or additionally, the one or more photoresists may be utilized for the subsequent further etching of the previously etched Au layer 272 and Cu support 268.

FIG. 2S illustrates a structure 238 formed by etching structure 236 illustrated in the example of FIG. 2R from Au protective layer 272 down to/through adhesion layers 221 in a die separation etching process. As a result, individual LEDs (each including a p-contact/anode-protective element, a metal support, a GaN device, an n-contact/cathode, etc.) may be separated, while still being held together by support carrier 213. Au protectivew layer 272 (and Au intermediate layer 266) may be etched utilizing a KI solution. Cu support 268 may be etched utilizing a solution containing one or more of cupric chloride ($CuCl_2$), hydrochloric (HCl), and hydrogen peroxide ($H_2O_2$).

FIG. 2T illustrates a structure 240 formed by removing the one or more photoresists from structure 238 illustrated in the example of FIG. 2S in a photoresist stripping process.

FIG. 2U illustrates structure 242 formed by attaching Au protective layer 272 of structure 240 illustrated in the example of FIG. 2T to a grip tape 201, e.g., a blue tape or UV tape. Grip tape 201 may be configured to stabilize (and maintain integrity and separation of) individual devices/LEDs in subsequent process steps.

FIG. 2V illustrates a schematic representation of a second support carrier de-bonding process, for removing support carrier 213. In one or more embodiments, wax adhesive 211 may have selectivity such that was adhesive 211 may be dissolved in both acetone and alcohol, while grip tape 201 may be dissolved in acetone, but not in alcohol. Alternatively or additionally, a solvent 203 utilized in the de-bonding process may have selectivity such that the solvent may dissolve wax adhesive 211, but not grip tape 201 and elements included in the devices. For example, solvent 203 may include isopropyl alcohol (IPA) that dissolves wax adhesive 211, but not grip tape 201.

In the de-bonding process, structure 242 (including grip tape 201) illustrated in the example of FIG. 2U or at least the device side of structure 242 may be immersed in solvent 203. As a result, wax adhesive 211 may be dissolved. Accordingly, support carrier 213 may be removed from structure 242. With the selectivity of wax adhesive 211 and/or solvent 203, the individual devices/LEDs are secured on grip tape 201 during the de-bonding process. Advantageously, separation between the devices and integrity of the devices may be maintained.

FIG. 2W illustrates individual devices/LEDs 241a-e further separated by expanding grip tape 201 in one or multiple opposite directions, such as directions 231 and 233, in a chip expanding process. Advantageously, LEDs 241a-e may be readily retrieved without significant damage. The structures of LEDS 241a-e may be similar to LED 300 illustrated in the example of FIG. 3.

Figure 3:
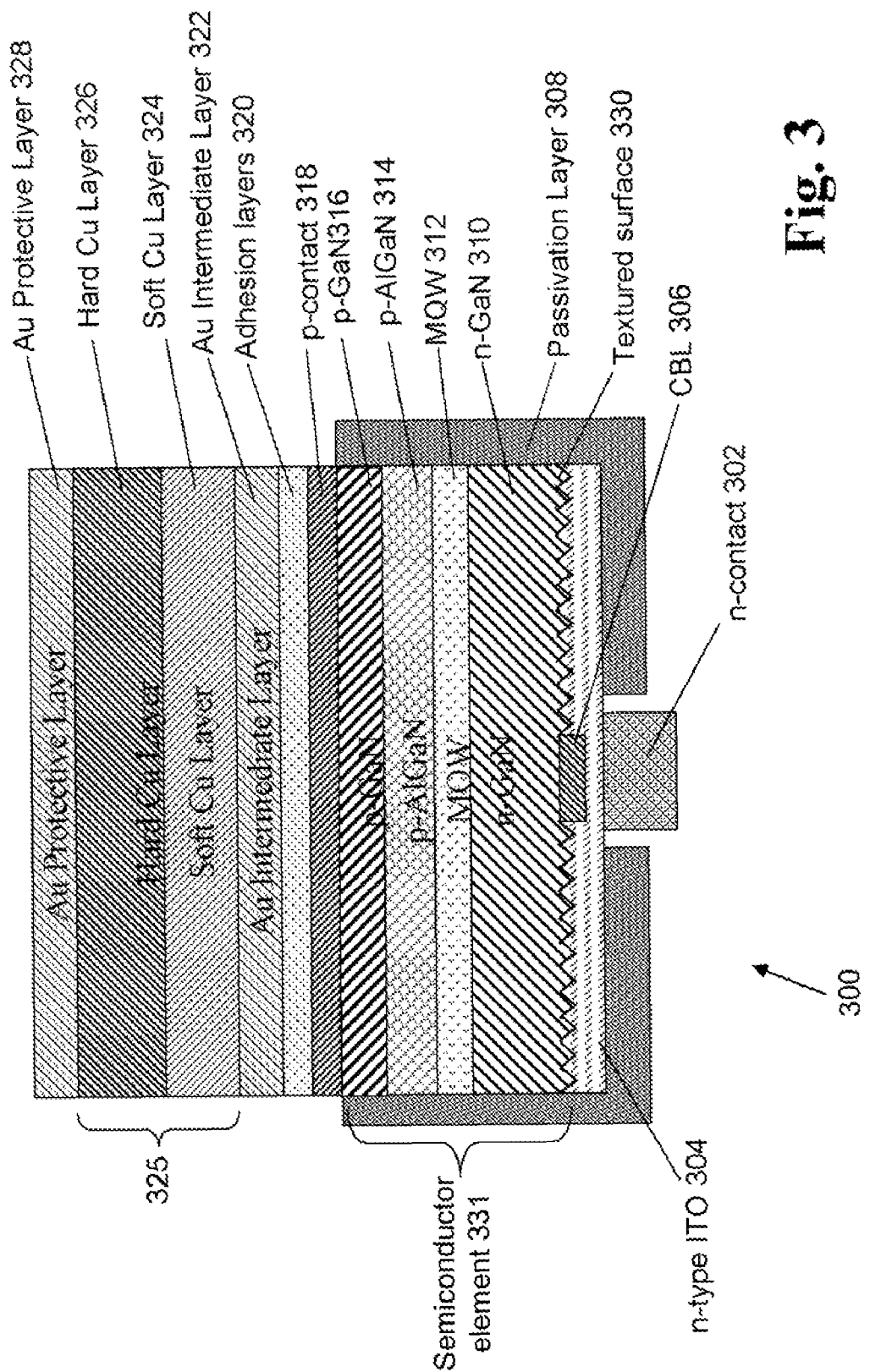
FIG. 3 illustrates a schematic representation of a (partial) cross sectional view of a LED in accordance with one or more embodiments of the present invention.

FIG. 3 illustrates a schematic representation of a (partial) cross sectional view of a LED 300 in accordance with one or more embodiments of the present invention. LED 300 may include an Au protective layer 328 configured to protect the underlying hard Cu layer 326. Au protective layer 328 may also serve as a anode/p-electrode of LED 300. Au protective layer 328 may also be configured to optimize thermal contact with a packing unit such as a heat sink or a lead frame for LED 300.

LED 300 may include a metal support 325 configured to provide structural robustness for LED 300 and to form part of an electrical path connecting Au protective layer 328. Metal support 325 may include hard Cu layer 326 in contact with Au protective layer 328 and configured to reinforce the structure of LED 300. Hard Cu layer 326 may enable a long and slender configuration of LED 300. In contrast, prior art LEDs may not be able to have a long and slender configuration given fragile sapphire or SiC substrates. Metal support 325 may also include a soft Cu layer next to hard Cu layer 326 configured to reduce stress buildup in LED 300.

LED 300 may also include an Au intermediate layer 322 configured to enable plating (e.g., electroplating) of metal support 325.

LED 300 may also include one or more adhesion layers 320 configured to structurally and electrically couple Au intermediate layer 322 with p-contact 318. The one or more adhesion layers may be made of one or more of Ni, Au, and Pd. P-contact 318 may be disposed on GaN element 331.

GaN element 331 may include a p-type GaN layer 316 electrically and structurally coupled with p-contact 318. GaN element 331 may also include an n-type GaN layer 310 located opposite to p-type GaN layer 316. N-type GaN layer 310 may include a textured surface 330 configured to optimize photon escape angles for increasing light extraction efficiency. GaN element 331 may also include a p-type GaN layer 316 and n-type GaN layer 310.

LED 300 may also include a CBL element 306 configured to expel electrons, thereby minimizing current crowding effect and improving current spreading. CBL element 306 may be disposed on n-type GaN layer 310.

LED 300 may also include an n-type ITO layer 304 covering n-type GaN layer 310 and CBL element 306. N-type ITO 304 may have a substantially higher conductivity and, therefore, a superior current spreading capability compared with a typical p-type ITO layer utilized in a typical prior art LED.

LED 300 may also include an n-contact (i.e., n-electrode or cathode) 302 disposed on n-type ITO 304.

LED 300 may also include a passivation layer 308 configured to protect GaN device 331. Passivation layer 308 may be formed of an insulator material, such as $SiO_2$.

FIG. 4A-C illustrates a comparison between light-emitting sides of prior art LEDs 410 and 420 with a light emitting side of LED 300 that is configured in accordance with one or more embodiments of the present invention.

As illustrated in FIG. 4A, prior art LED 410 may include an n-contact 412a disposed on an n-type GaN layer 424. Prior art LED 410 may also include a p-contact 412b disposed on a p-type ITO layer 426. P-contact 412b may be configured at an offset location with respect to n-contact 412a. Given a fragile sapphire or SiC substrate, for the light-emitting side of LED 410 illustrated in the example of FIG. 4A showing both n-contact 412a and p-contact 412b, LED 410 may have a substantially square configuration with an aspect ratio of about 1:1. For example, both the length 410x and the width 410y of the light-emitting side of LED 410 may be about 340 μm.

As illustrated in the example of FIG. 4B, prior art LED 420 may have a light-emitting side with an aspect ratio of about 2:1. For example, the light-emitting side may have a length 420x of about 480 μm and a width 420y of about 240 μm.

In contrast, as illustrated in the example of FIG. 4C, LED 300, fabricated/configured in accordance with one or more embodiments of the invention, may show only n-contact 302 on the light-emitting side, without requiring a p-contact on the light-emitting side. N-contact 302 may be disposed on n-type ITO layer 304, which may have a superior current spreading capability compared with p-type ITO layers, such as p-type ITO layer 426, of prior art LEDs 410 and 420.

A cross-sectional view A-A of LED 300 may be illustrated in the example of FIG. 3. With metal support 325, LED 300 may have an elongated configuration of the light-emitting side. For example, the aspect ratio of the light-emitting side of LED 300 may be greater than 3:1. In an example, the aspect ratio may be 8:1, with a length 430x of about 960 µm, and a width 430y of about 120 µm.

LED 300 may include a finger 434 (or electrode extension 434) extended from n-contact 302. Finger 434 may be configured to promote current spreading such that currents may be substantially, evenly spread throughout the light-emitting side of LED 300.

FIGS. 5A-F illustrate example configurations of fingers (i.e., electrode extensions) of LEDs in accordance with one or more embodiments of the present invention.

In the example of FIG. 5A, a LED 510 may have a linear finger 512 extended from an n-contact 511. Finger 512 may also be non-linear.

In the example of FIG. 5B, a LED 520 may include two fingers 522 and 523 extended from (different sides of) an n-contact 521. Fingers 522 and 523 may have the same length. Each of fingers 522 and 523 may be linear or non-linear. Fingers 522 and 523 may be aligned with each other or parallel to each other.

In the example of FIG. 5C, LED 530 may include fingers 532 and 533 extended from (different sides of) a contact 531. Fingers 532 and 533 may have different lengths, and each may be linear or non-linear.

Figure 5D:
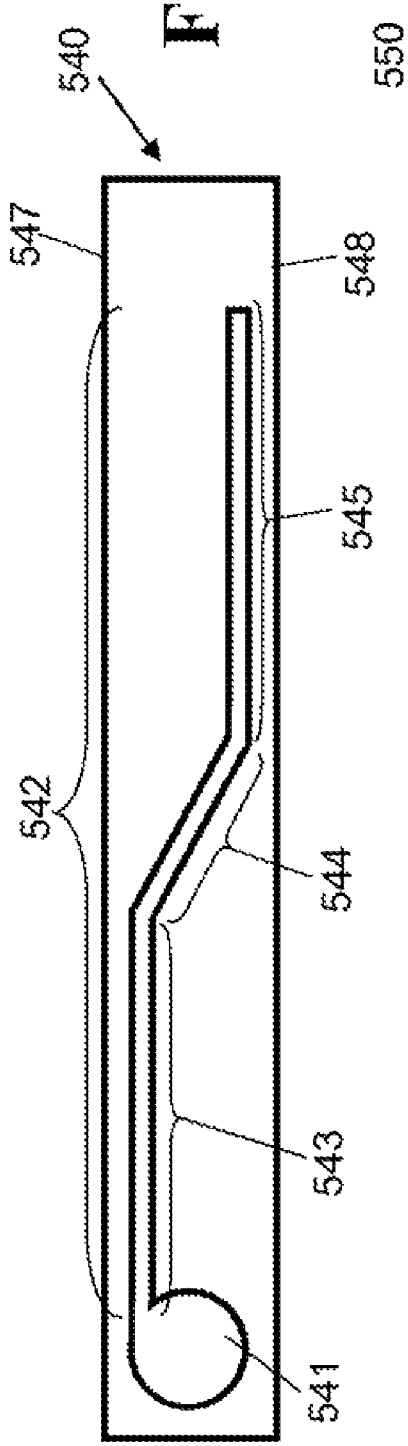

In the example of FIG. 5D, LED 540 may include a finger 542 extended from a contact 541. Finger 542 may include multiple sections, such as a first section 543, a second section 544, and a third section 545. First section 543 may be parallel to a first edge 547 and may be closer to first edge 547 than third section 545. Third section 545 may be parallel to a second edge 548 and may be closer to second edge 548 than first section 543.

Figure 5E:
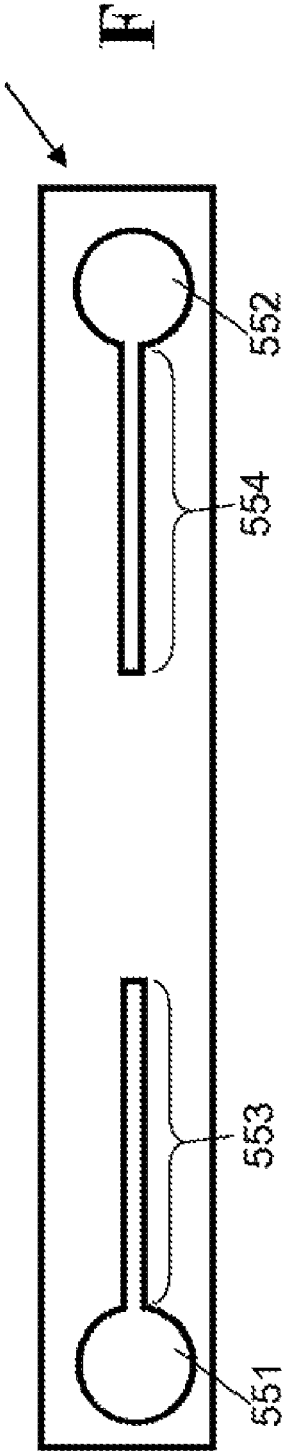

In the example of FIG. 5E, LED 550 may include a first finger 553 extended from a first n-contact 551. LED 550 may also include a second finger 554 extended from a second n-contact 552. First contact 551 and second contact 552 may have the same polarity. Second finger 554 may be aligned with first finger 553.

Figure 5F:
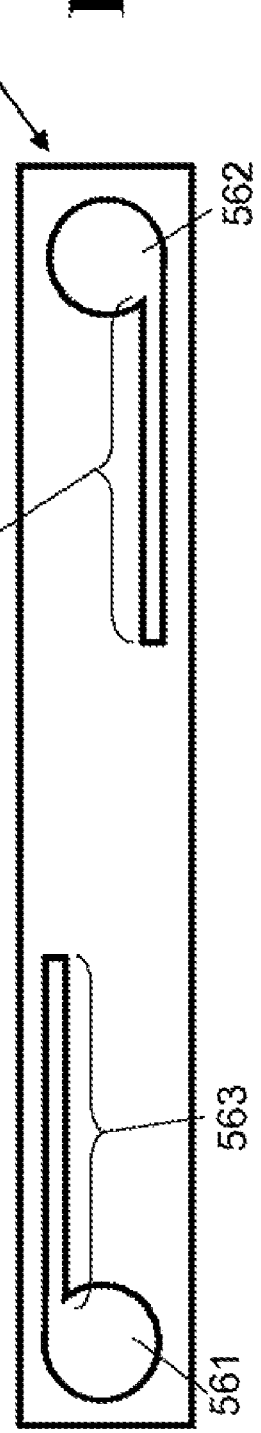

In the example of FIG. 5F, device LED 560 may include a first finger 563 extended from first contact 561. LED 560 may also include a second finger 564 extended from a second contact 562. First contact 561 and second contact 562 may have the same polarity. First finger 563 and second finger 564 may or may not be aligned with each other. First finger 563 and second finger 564 may or may not be parallel to each other.

Advantageously, with various configurations of the one or more fingers extended from LED electrodes, light beam profiles and lighting effects may be tuned for various lighting applications.

FIGS. 6A-B illustrate a comparison between a prior art LED arrangement and an LED arrangement in accordance with one or more embodiments of the invention utilized in LCD backlight unit applications.

In the example of FIG. 6A, prior art BLU module 600 may require 12 LEDs 602a-l to illuminate BLU 604, given the low aspect ratio of the light-emitting sides of LEDs 602a-l. The profile of light beam 606 generated by one or more of LEDs 602a-l may be relatively narrow and short.

In contrast, in the example of FIG. 6B, an BLU module 650, configured in accordance with one or more embodiments of the present invention, may require only 6 LEDs 652a-f to illuminate BLU 656 (having the same thickness and property as BLU 606), given the high aspect ratio of the light-emitting sides of LEDs 652a-f. Further, the profile of the light beam 656 generated by one or more of LEDs 652a-f may be wider and longer than the profile of light beam 606 generated by one or more of LEDs 602a-l. For example, heights 656y2 of light beam 656 may be greater than heights 606y1 and 606y2 of light beam 606, respectively. Further, length 656x of light beam 656 may also be greater than length 606x of light beam 606.

As can be appreciated from the foregoing, embodiments of the present invention may provide elongated LEDs for illumination applications, such as backlighting of LCDs. With elongated configurations of LEDs, embodiments of the invention may reduce the number of LEDs required and/or may reduce thicknesses of LCD panels. Advantageously, material and manufacturing costs may be reduced for electronic devices that include LEDs. Form factors of the electronic devices also may be optimized. Further, with optimal use of n-type ITO and CBL elements, current spreading in LEDs may be improved, and lighting efficiency of LEDs may be advantageously optimized. As a result, power consumption and heat generation of the electronic devices also may be reduced. Advantageously, performance and durability of electronic devices may be improved.

Further, with chemical separation of LEDs, instead of utilizing costly and time-consuming mechanical separation techniques (e.g., grinding or scribing), embodiments of the invention may also provide the following advantages:

1. Process yield improvement. Embodiments of the invention may not require any physical abrasive action or heat to remove materials to separate interconnected device. Multiple numbers of wafers can be separated at once by dipping multiply stacked wafers into processing chemicals. Hence, there may be no limitation in the number of wafers to be processed. The device separation process yield can be obtained as high as 95%. Productivity also may be significantly improved.

2. Device performance improvement. Since embodiments of the invention utilize one or more chemical processes instead of mechanical processes, there may be no device degradation after device separation. Embodiments of the invention may also reduce the stress build up during the dry etch process by chemical annealing.

3. Cost saving. The invention does not require expensive capital equipment investment, only inexpensive stripping or etching chemicals may be needed along with an inexpensive chemical bath. In accordance with one or more embodiments of the invention, through-put can be a multiple compared to conventional methods, and process cost per wafer may be estimated to be a fraction compared to conventional methods.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section may be provided herein for convenience and, due to word count limitation, may be accordingly written for reading con- What may be claimed is:

1. A light emitting diode (LED) comprising:
   a light-emitting side;
   a first electrode disposed on the light-emitting side;
   a second electrode;
   a semiconductor element disposed between the first electrode and the second electrode; and
   a metal support element disposed between the semiconductor element and the second electrode, the metal support element configured to provide structural support for the LED;
   one or more adhesion layers disposed between the semiconductor element and the metal support element and configured to form part of an electrical path between the semiconductor element and the metal support element, wherein the one or more adhesion layers include a first adhesion layer, the first adhesion layer being in contact with at least one of a metal contact and a metal intermediate layer, the metal contact being in contact with the semiconductor element, the metal intermediate layer being in contact with the metal support layer.

2. The LED of claim 1 wherein a length of the light-emitting side at least three times a width of the light-emitting side.

3. The LED of claim 1 wherein a length of the light-emitting side is at least seven times a width of the light-emitting side.

4. The LED of claim 1 further comprising a first extension connected to the first electrode, the first extension is disposed on the light-emitting side, running over the light-emitting side and configured for spreading current on the light-emitting side.

5. The LED of claim 4 wherein a length of the first extension is at least three times a width of the light-emitting side.

6. The LED of claim 4 wherein the first electrode further includes a second extension, the first extension and the second extension having a same length.

7. The LED of claim 4 wherein the first electrode further includes a second extension, the first extension and the second extension having a same width but different lengths.

8. The LED of claim 4 wherein the first extension includes a first section, a second section, and a third section between the first section and the second section, the first section may be disposed closer to a first edge of the light-emitting side than the second section, and the second section may be disposed closer to a second edge of the light-emitting side than the first section.

9. The LED of claim 8 wherein the first section may be parallel to the first edge of the light-emitting side, and the second section may be parallel to the second edge of the light-emitting side.

10. The LED of claim 4 further comprising a third electrode disposed on the light-emitting side, the first electrode and the third electrode having a same polarity.

11. The LED of claim 10 wherein the third electrode includes an extended portion configured to facilitate current spreading on the light-emitting side.

12. The LED of claim 11 wherein the extended portion may be aligned with the first extension.

13. The LED of claim 11 wherein the first extension may be disposed closer to a first edge of the light-emitting side than the extended portion.

14. The LED of claim 1 wherein the semiconductor element includes a p-type portion and an n-type portion, the p-type portion is disposed closer to the metal support element than the n-type portion, and the n-type portion is disposed closer to the light-emitting side than the p-type portion.

15. The LED of claim 1 wherein the semiconductor element is made of one or more materials including at least one of GaN, AlGaN, AlGaAs, AlGaP, AlGaInP, GaAsP, GaP, and InGaN.

16. The LED of claim 1 wherein the semiconductor element is made of one or more materials including GaN.

17. The LED of claim 1 wherein the semiconductor element includes a textured surface configured to optimize photon escape angles.

18. The LED of claim 17 wherein the textured surface is a surface of an n-type portion of the semiconductor element.

19. The LED of claim 1 wherein the first electrode is a cathode and the second electrode may be an anode.

20. The LED of claim 1 wherein the second electrode is electrically coupled with the metal support element and configured to protect the metal support element from oxidation.

21. The LED of claim 1 wherein the metal support element includes a first metal element and a second metal element, the first metal element is disposed closer to the semiconductor element than the second metal element, and the first element is configured to reduce stress buildup in the LED.

22. The LED of claim 1 wherein the metal support element is made of one or more materials including Cu.

23. The LED of claim 1 further comprising a current blocking element disposed between the first electrode and the semiconductor element, disposed on an n-type portion of the semiconductor, and configured to expel electrons, wherein the first electrode is a cathode.

24. The LED of claim 1 further comprising an n-type current spreading element disposed between the first electrode and the semiconductor element.

25. The LED of claim 24 wherein the n-type current spreading element is an n-type ITO element in contact with a current blocking element and in contact with a textured surface of an n-type portion of the semiconductor element.

26. The LED of claim 1 further comprising a metal intermediate layer disposed between the semiconductor element and the metal support element, the metal intermediate layer being in contact with the metal support element, the metal intermediate layer and the metal support element being made of different materials.

27. The LED of claim 1 wherein the one or more adhesion layers are made of one or more of Ni, Au, and Pd.

28. The LED of claim 1 wherein the first adhesion layer is made of one or more materials including Ni.

29. The LED of claim 1 wherein the one or more adhesion layers further include a second adhesion layer in contact with the metal intermediate layer and a third adhesion layer disposed between the first adhesion layer and the second adhesion layer.

30. The LED of claim 1 wherein the metal contact is a p-contact.

31. The LED of claim 1 wherein a thickness of the metal support element is greater than 50 um.

* * * * *